(12) United States Patent
Akimoto

(10) Patent No.: US 7,541,213 B2
(45) Date of Patent: Jun. 2, 2009

(54) SEMICONDUCTOR DEVICE AND MANUFACTURING METHOD THEREOF

(75) Inventor: Kengo Akimoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 69 days.

(21) Appl. No.: 11/822,924

(22) Filed: Jul. 11, 2007

(65) Prior Publication Data

US 2008/0017923 A1    Jan. 24, 2008

(30) Foreign Application Priority Data

Jul. 21, 2006  (JP) .............................. 2006-199354

(51) Int. Cl.
*H01L 21/00* (2006.01)
(52) U.S. Cl. ......................... 438/48; 438/128; 438/149; 438/151; 438/157
(58) Field of Classification Search ................... 438/48, 438/128, 149, 151, 157; 257/288, 59, 72, 257/E27.111
See application file for complete search history.

(56) References Cited

U.S. PATENT DOCUMENTS

| 4,939,568 | A | 7/1990 | Kato et al. |
| 5,507,924 | A | 4/1996 | Mikumo et al. |
| 5,541,876 | A | 7/1996 | Hsue et al. |
| 6,934,842 | B2 | 8/2005 | Okamoto et al. |
| 7,178,026 | B2 | 2/2007 | Okamoto et al. |
| 7,217,653 | B2 | 5/2007 | Wang et al. |
| 2005/0133605 | A1 | 6/2005 | Koyama et al. |
| 2005/0133790 | A1 | 6/2005 | Kato |
| 2005/0146006 | A1 | 7/2005 | Yamazaki et al. |
| 2006/0049056 | A1 | 3/2006 | Wang et al. |

FOREIGN PATENT DOCUMENTS

| JP | 3578057 | 10/2004 |
| WO | WO 2005/081307 | 9/2005 |

*Primary Examiner*—Evan Pert
*Assistant Examiner*—Tan N Tran
(74) *Attorney, Agent, or Firm*—Eric J. Robinson; Robinson Intellectual Property Law Office, P.C.

(57) ABSTRACT

The semiconductor device includes a thin film transistor; a first interlayer insulating film over the thin film transistor; a first electrode electrically connected to one of a source region and a drain region, over the first interlayer insulating film; a second electrode electrically connected to the other of the source region and the drain region; a second interlayer insulating film formed over the first interlayer insulating film, the first electrode, and the second electrode; a first wiring electrically connected to one of the first electrode and the second electrode, on the second interlayer insulating film; and a second wiring not electrically connected to the other of the first electrode and the second electrode, on the second interlayer insulating film; in which the second wiring is not electrically connected to the other of the first electrode and the second electrode by a separation region formed in the second interlayer insulating film.

12 Claims, 26 Drawing Sheets

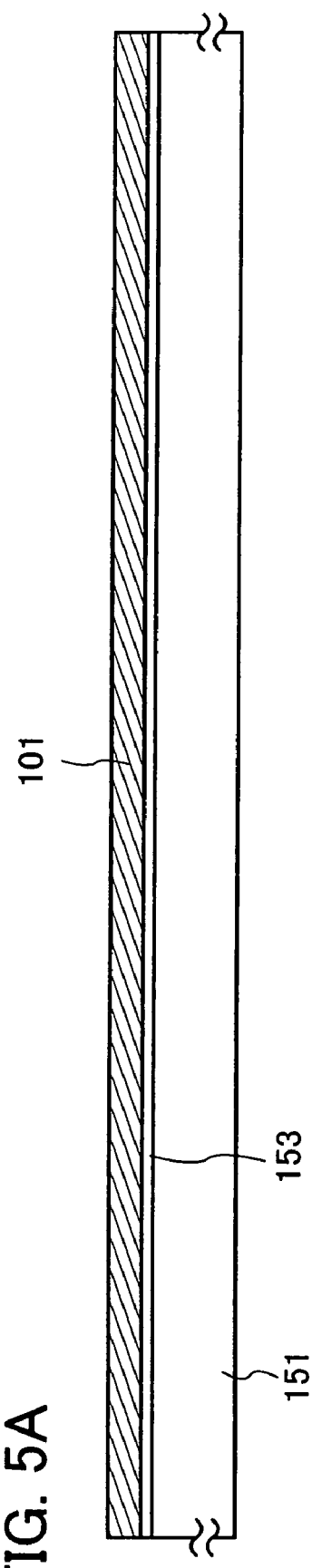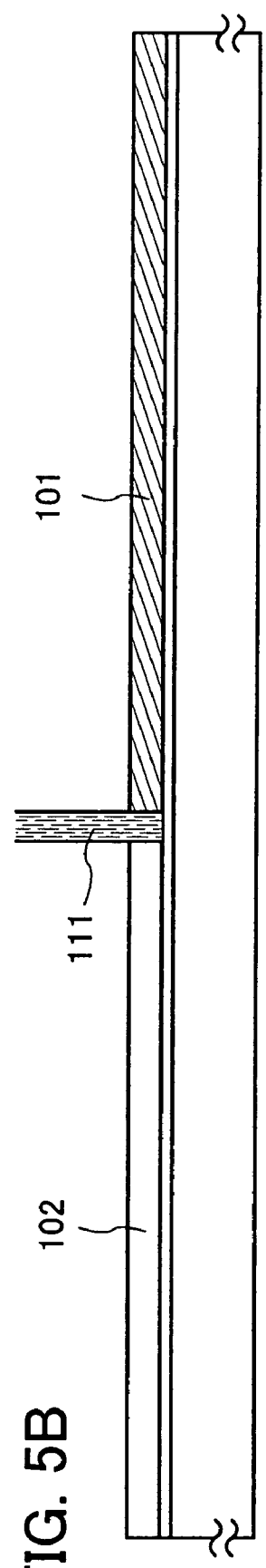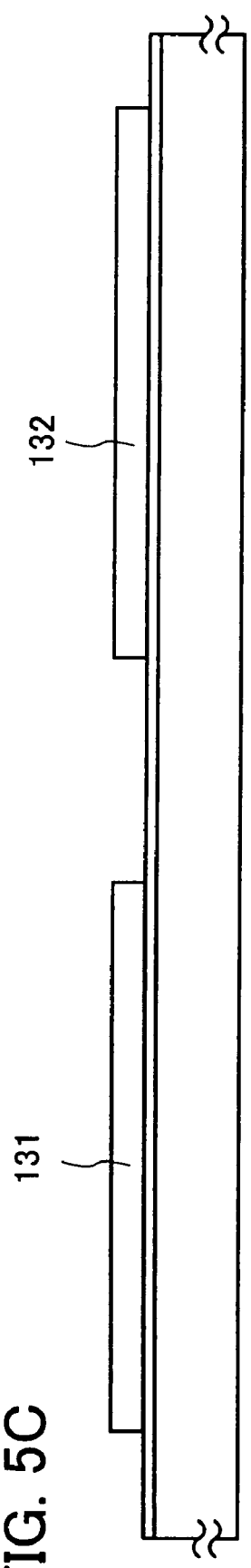

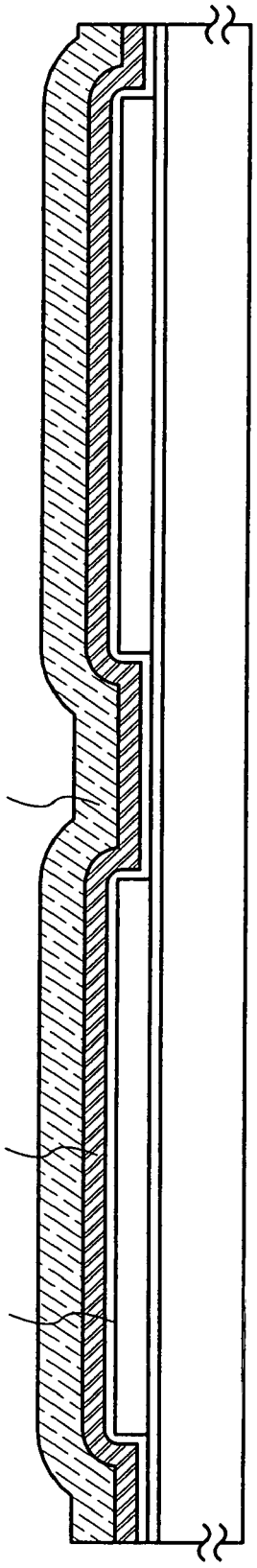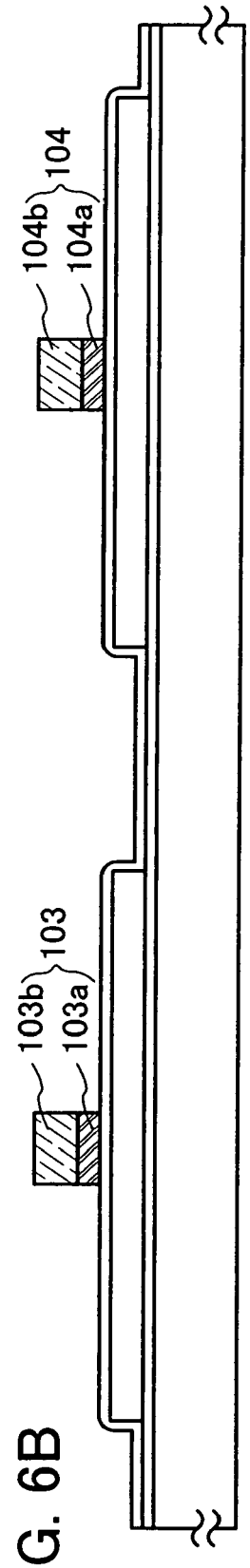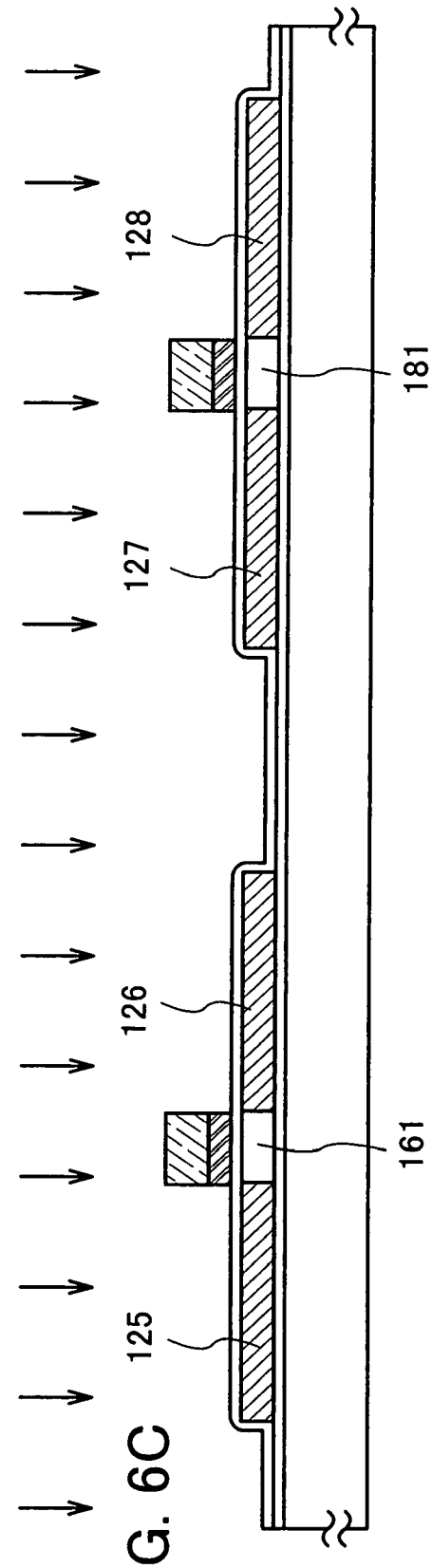

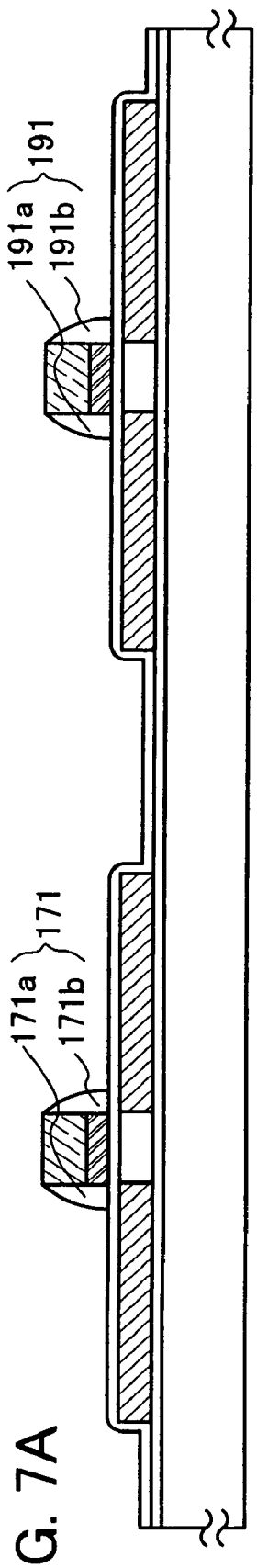
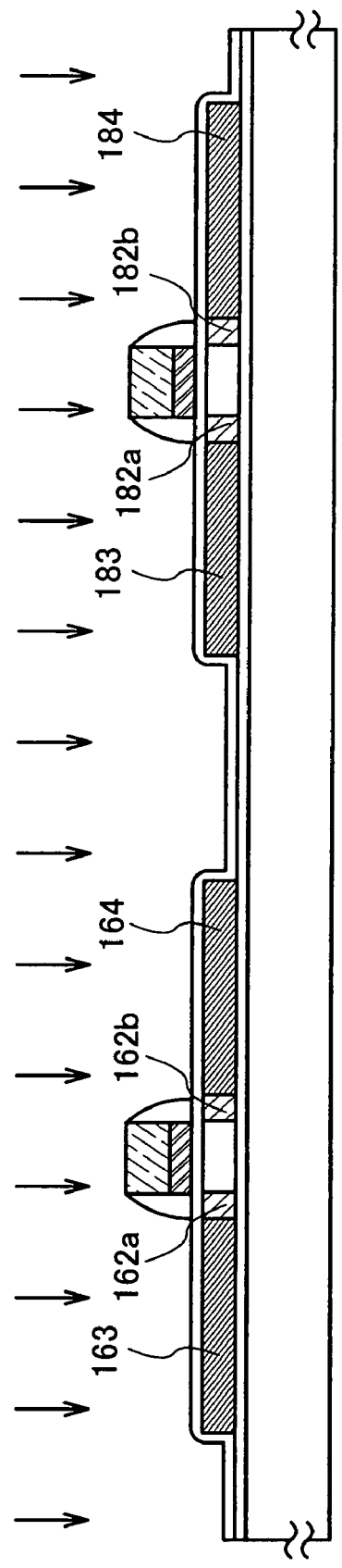
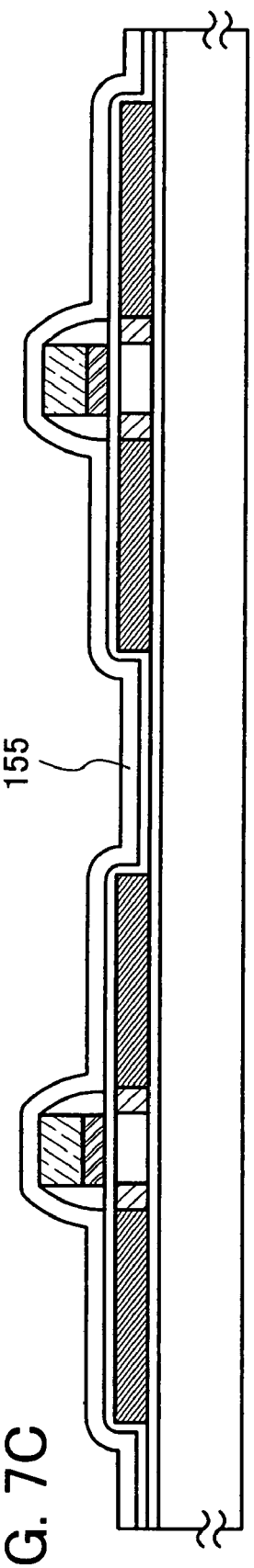
FIG. 7A
FIG. 7B
FIG. 7C

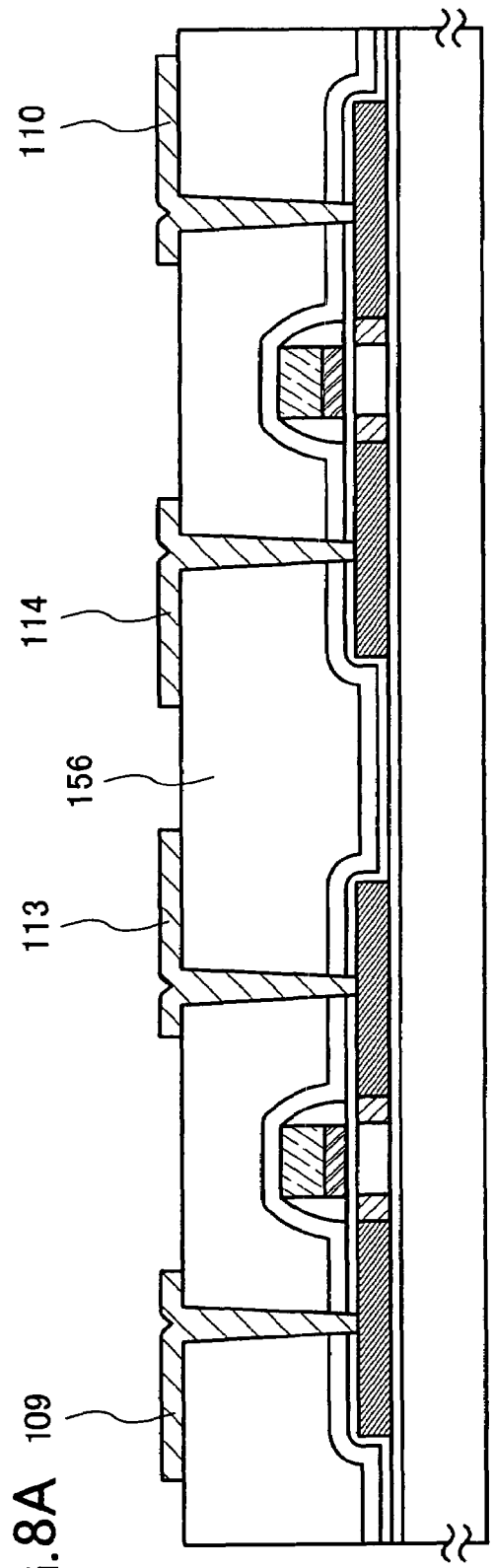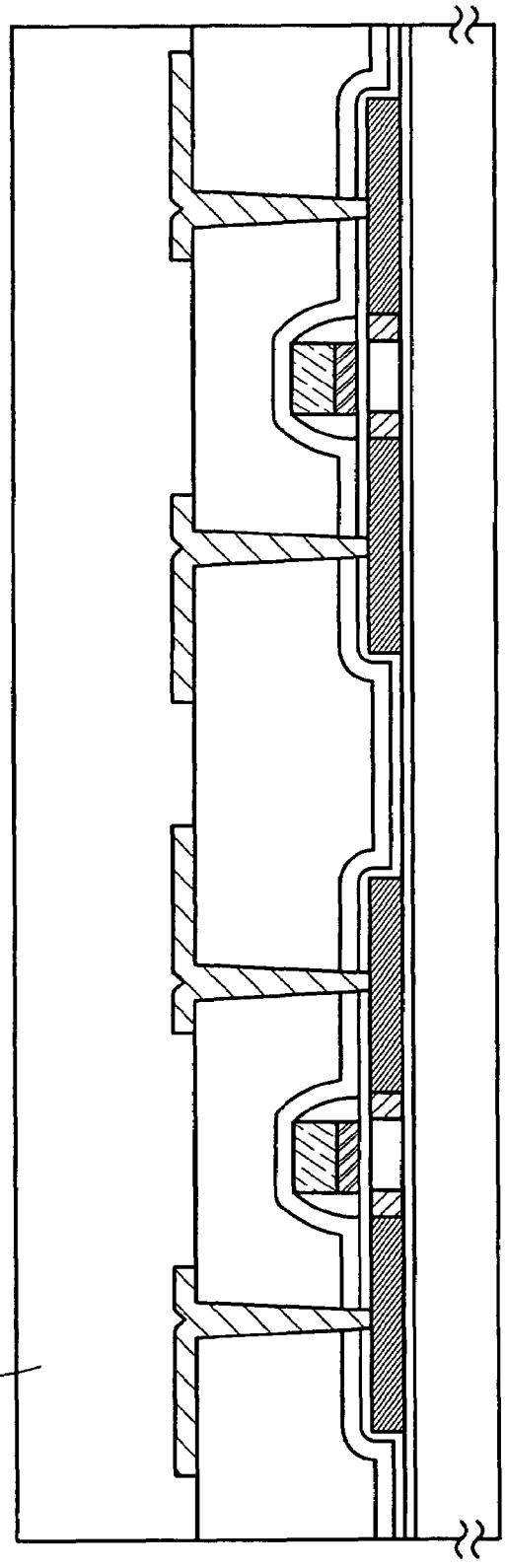

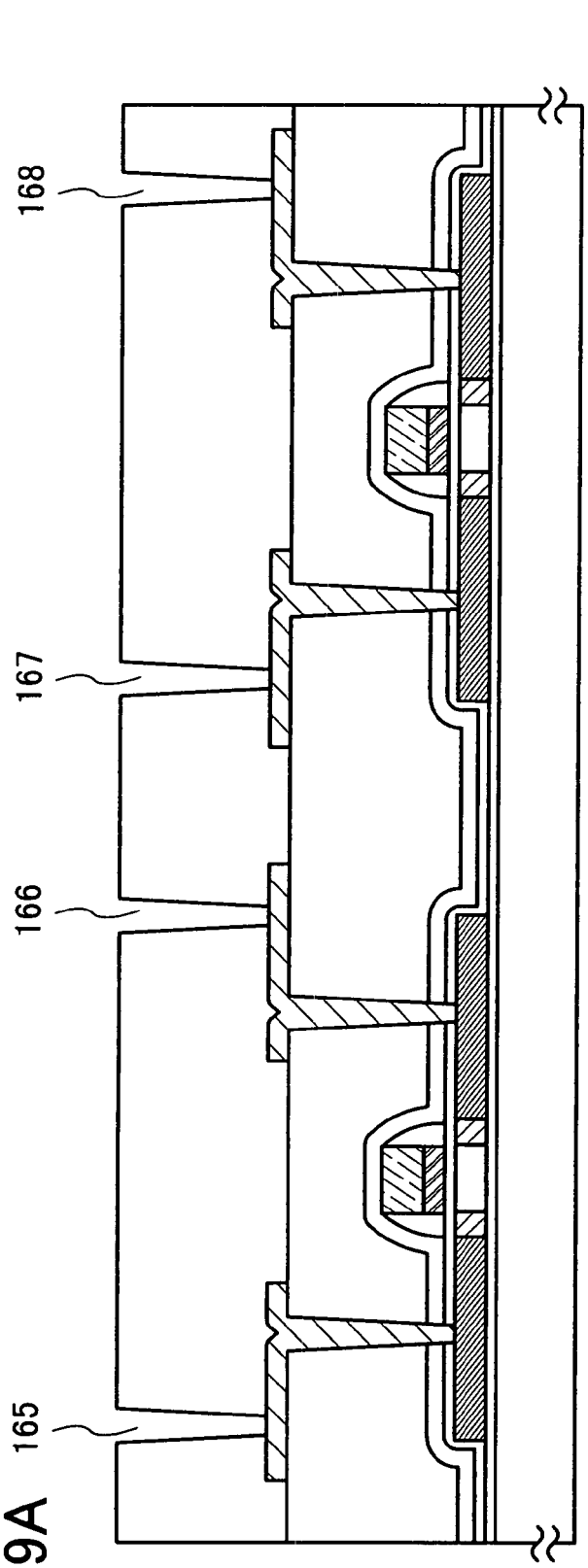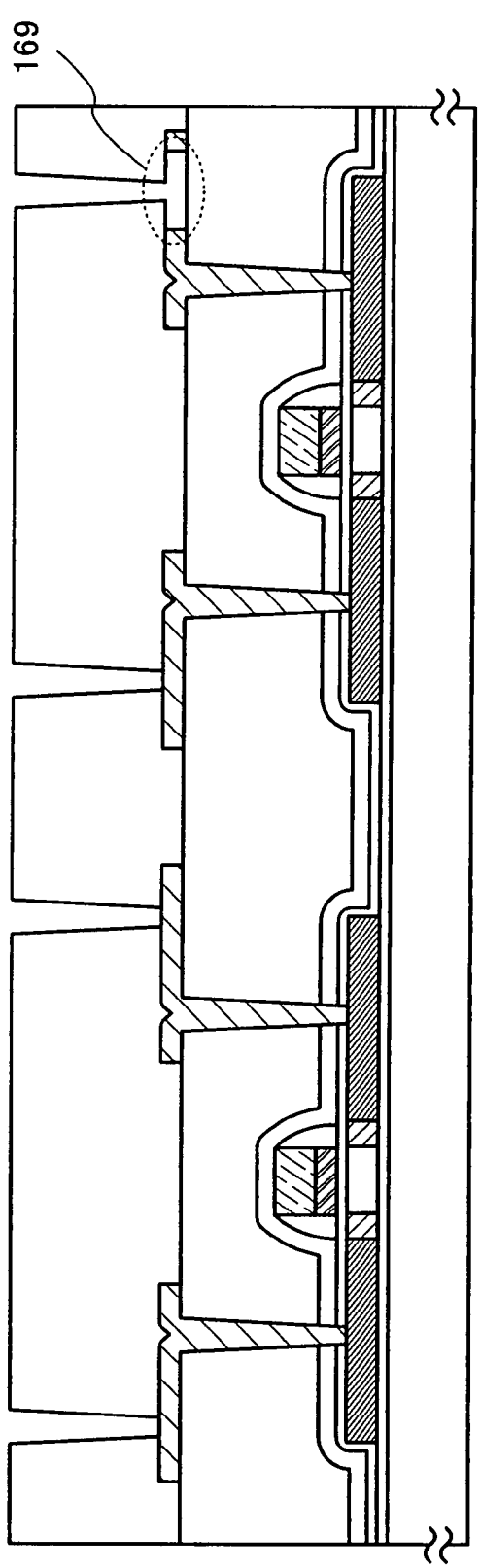

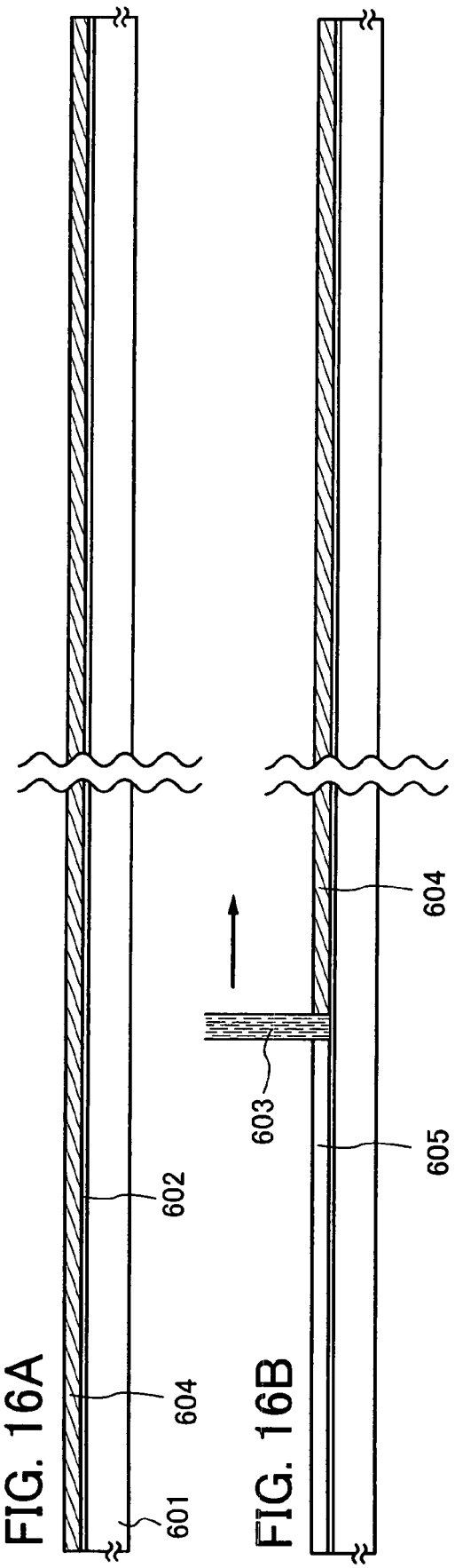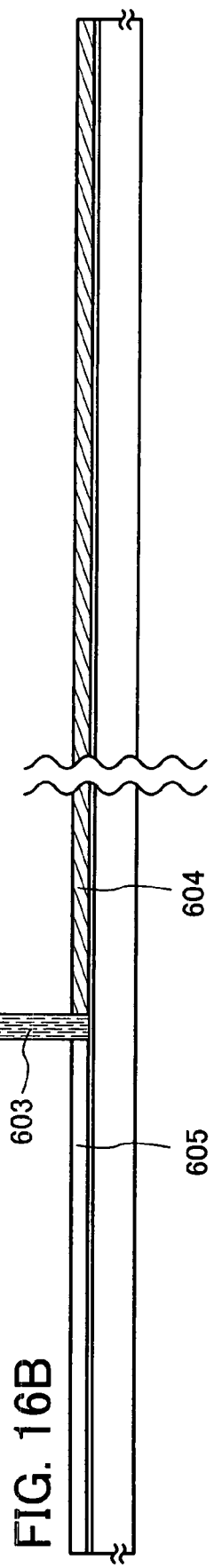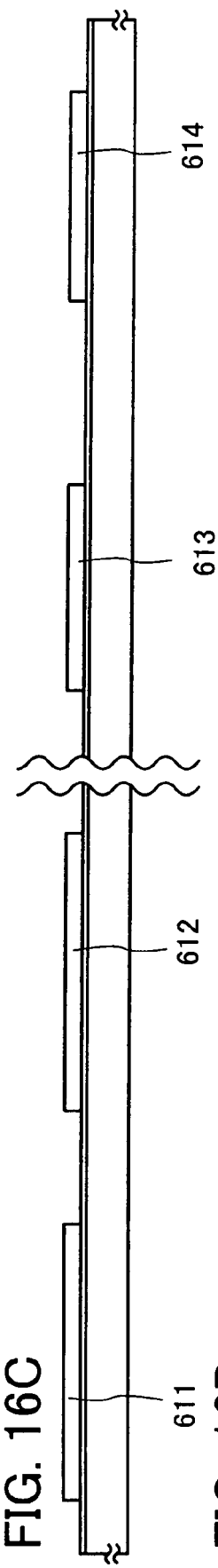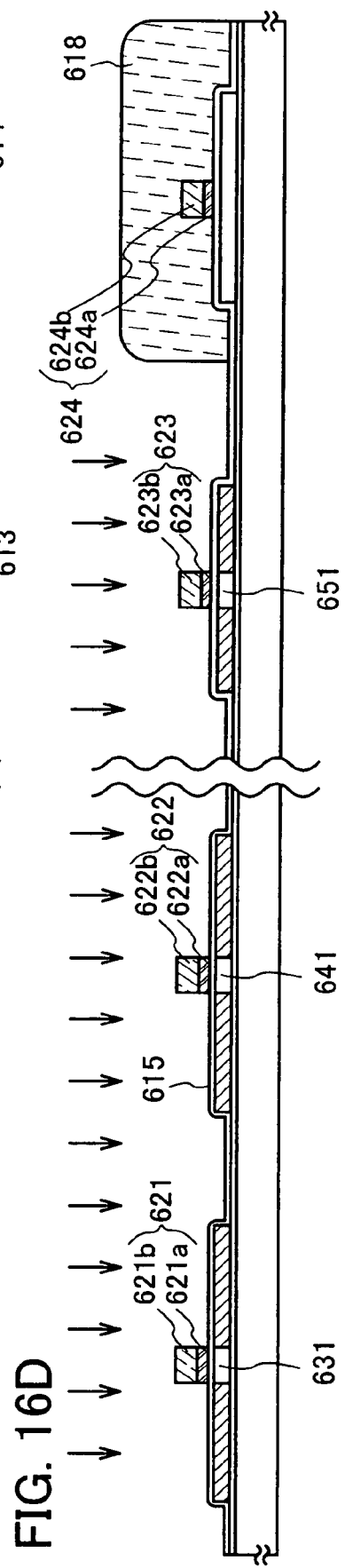

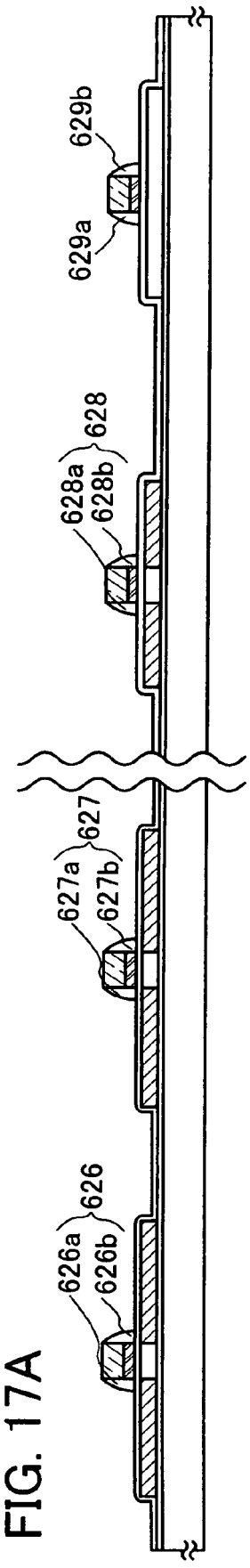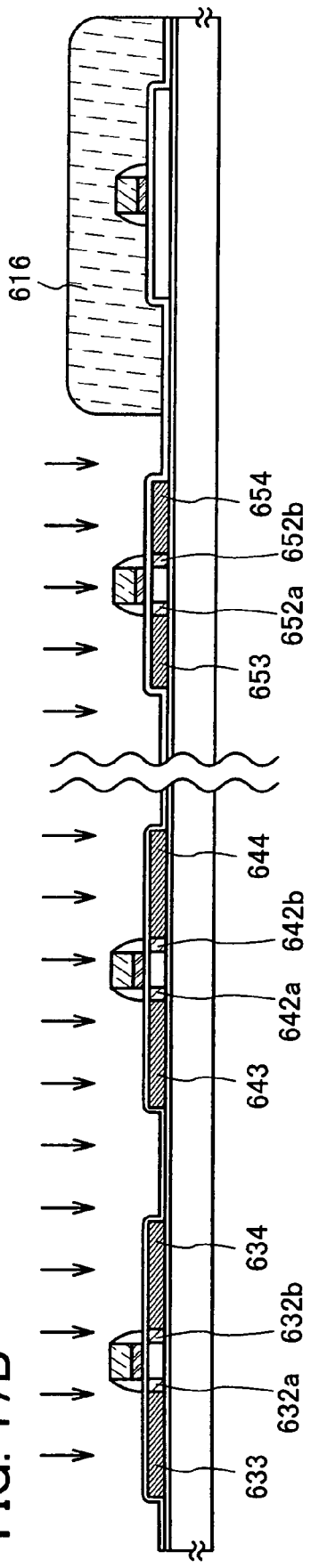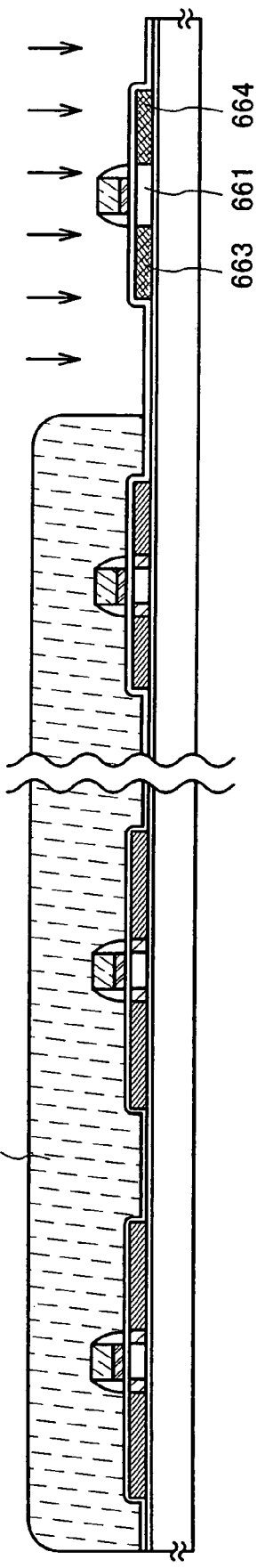

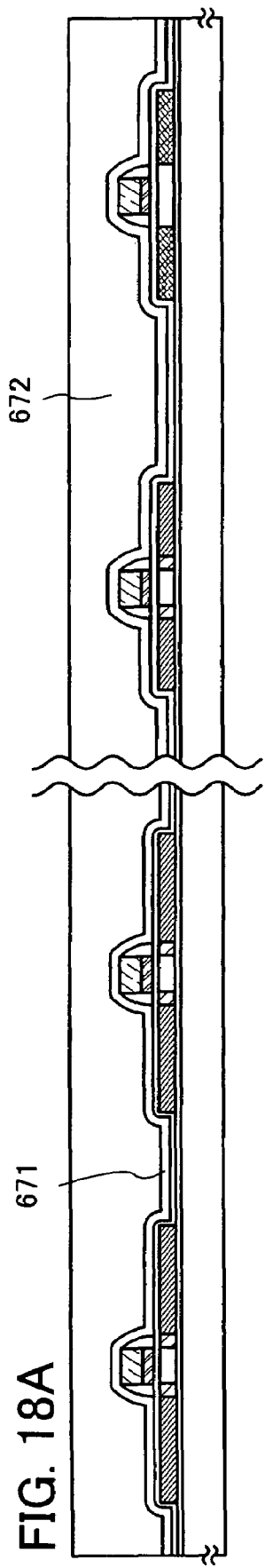
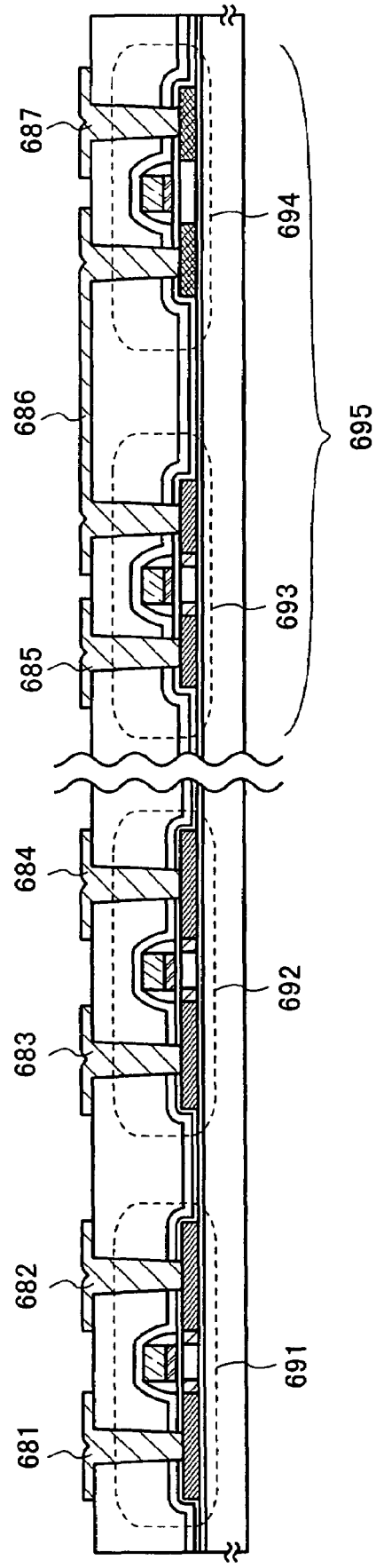
FIG. 18A
FIG. 18B
FIG. 18C

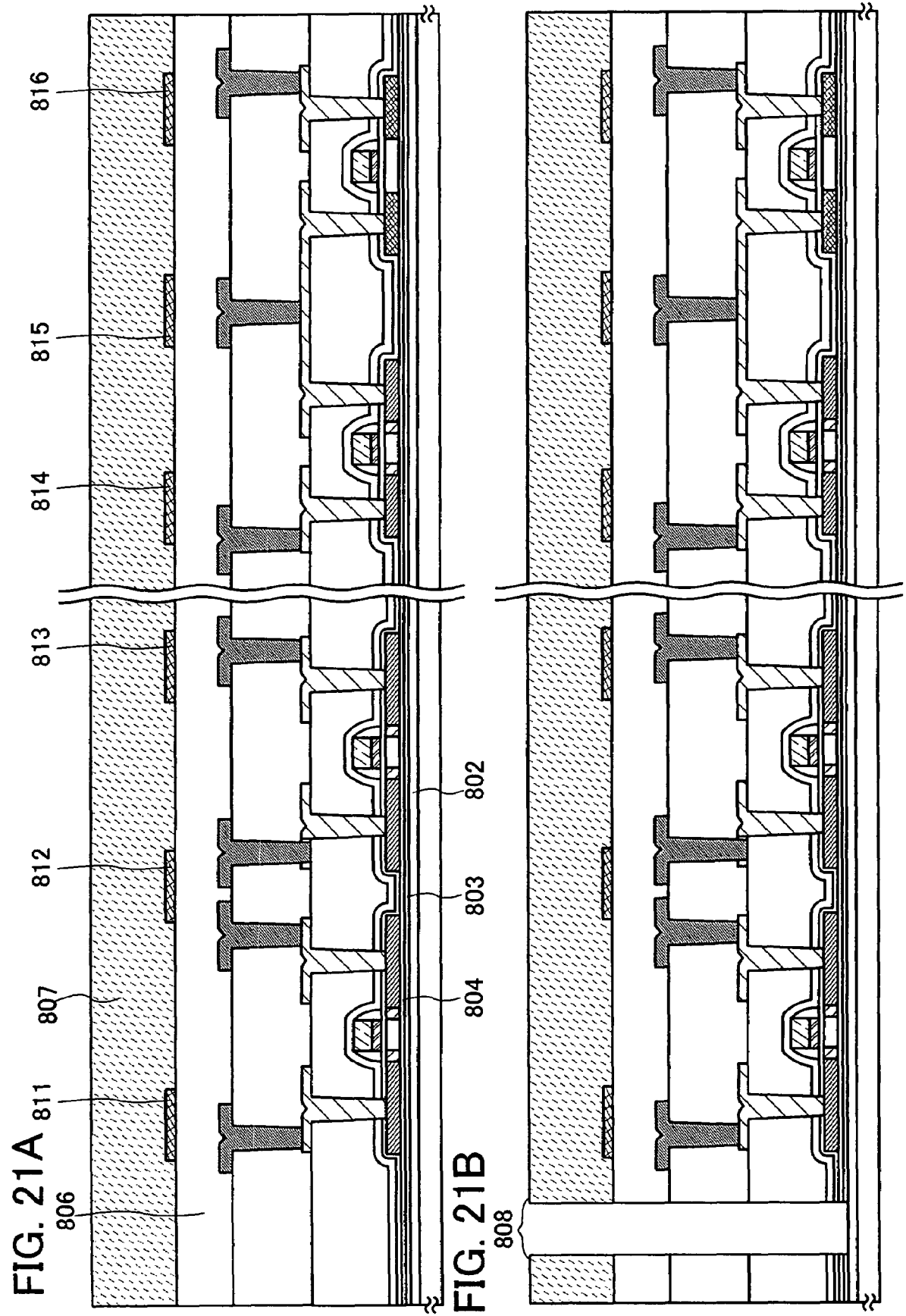

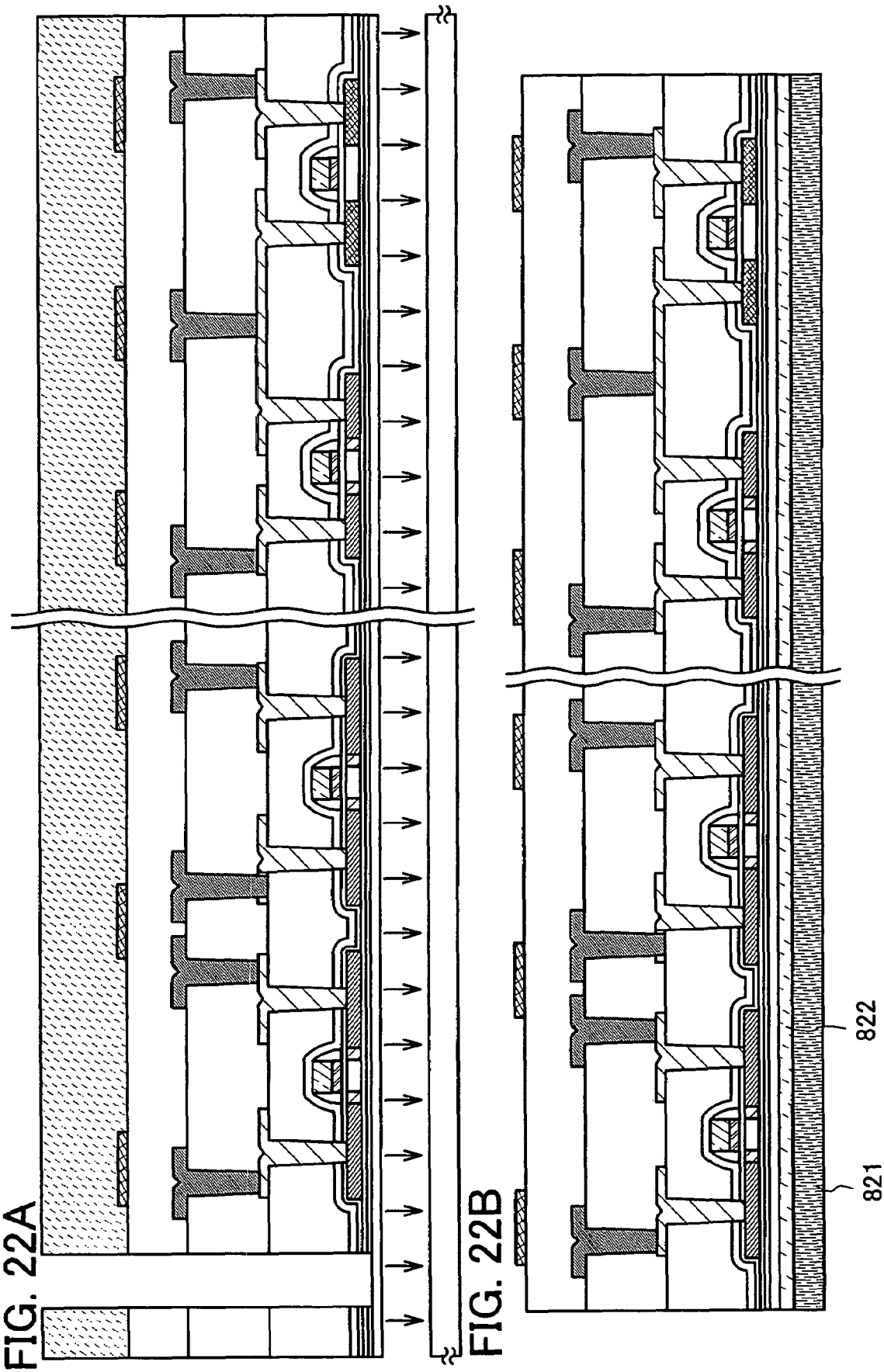

SEMICONDUCTOR DEVICE AND MANUFACTURING METHOD THEREOF

BACKGROUND OF THE INVENTION

1. Field of the Invention

The present invention relates to semiconductor devices capable of communication with the use of contactless means such as wireless communication, and a manufacturing method thereof. In particular, the present invention relates to a semiconductor device that is formed over an insulating substrate of glass, plastic, or the like and a manufacturing method thereof.

2. Description of the Related Art

With development of computer technologies and improvement of image recognition technologies, data identification methods utilizing a medium such as bar codes have spread widely and have been used for identification of product data and the like. It is expected that the amount of data to be identified will further increase in the future. On the other hand, data identification utilizing bar codes is disadvantageous in that a bar code reader is required to be in contact with the bar codes, and that the amount of data capable of being stored in the bar codes is small. Therefore, contactless data identification and increase in the storage capacity of a medium are required.

In view of the foregoing requirements, a semiconductor device capable of wireless communication that uses an IC (also referred to as an ID chip, an IC chip, an IC tag, an ID tag, a wireless chip, or an RFID) has been developed recently. The data is stored in a memory circuit in the IC in the semiconductor device and is read by contactless means, generally wireless means. Practical application of such a semiconductor device will allow commercial distribution and the like to be simplified and made cheaper while ensuring high security.

An overview of an individual recognition system using the above-described semiconductor device capable of wireless communication that uses an IC is described with reference to FIG. 2, FIG. 3, and FIGS. 4A and 4B. FIG. 2 illustrates an overview of an individual recognition system for recognizing individual data on a bag without contact.

A semiconductor device 221 storing particular individual data is attached to or embedded in a bag 224. A signal is transmitted to the semiconductor device 221 from an antenna unit 222 which is electrically connected to an interrogator (also referred to as a reader/writer) 223. When receiving the signal, the semiconductor device 221 sends back the individual data that the semiconductor device holds to the antenna unit 222. The antenna unit 222 sends the individual data to the interrogator 223, and the interrogator 223 identifies the individual data. In this manner, the interrogator 223 can obtain the individual data on the bag 224. Furthermore, this system enables physical distribution management, counting, exclusion of a counterfeit, and the like.

For example, such a semiconductor device has a structure shown in FIG. 3. A semiconductor device 200 includes an antenna circuit 201, a rectifier circuit 202, a stabilizing power supply circuit 203, an amplifier 208, a demodulation circuit 213, a logic circuit 209, a memory control circuit 212, a memory circuit 211, a logic circuit 207, an amplifier 206, and a modulation circuit 205.

For example, the antenna circuit 201 includes an antenna coil 241 and a capacitor 242 (FIG. 4A). For example, the rectifier circuit 202 includes diodes 243 and 244 and a capacitor 245 (FIG. 4B).

An operation of such a semiconductor device capable of wireless communication that uses an IC is described below. A wireless signal received by the antenna circuit 201 is half-wave rectified by the diodes 243 and 244 and then smoothed by the capacitor 245. The smoothed voltage containing a plurality of ripples is stabilized by the stabilizing power supply circuit 203, and the stabilized voltage is supplied to the demodulation circuit 213, the modulation circuit 205, the amplifier 206, the logic circuit 207, the amplifier 208, the logic circuit 209, the memory circuit 211, and the memory control circuit 212.

Moreover, a signal received by the antenna circuit 201 is input to the logic circuit 209 as a clock signal through the amplifier 208. Further, a signal input from the antenna coil 241 is demodulated by the demodulation circuit 213 and input as data to the logic circuit 209.

In the logic circuit 209, the input data is decoded. Since the interrogator 223 sends data after having encoded it, the logic circuit 209 decodes the data. The decoded data is sent to the memory control circuit 212, and then data stored in the memory circuit 211 is read out.

It is necessary that the memory circuit 211 be a nonvolatile memory circuit which is capable of storing data even when the power is OFF, and a ROM (Read Only Memory), or the like is employed (Japanese Patent No. 3578057).

As a transmitted/received signal, 125 kHz, 13.56 MHz, 915 MHz, 2.45 GHz, or the like may be employed, to each of which the ISO standard or the like is applied. In addition, a standard is also set for a modulation and demodulation system in transmission/reception.

SUMMARY OF THE INVENTION

In order to manufacture the above-described semiconductor device capable of wireless communication that uses an IC, a nonvolatile memory circuit, for example, a mask ROM has been necessarily formed as described above.

However, the mask ROM (hereinafter simply referred to as a ROM) can only write data at the time of manufacturing. Therefore, data is written at the same time as the manufacture of the mask ROM in manufacturing the semiconductor device.

Individual data of an individual semiconductor device such as an ID number is stored in a ROM. The individual data such as the ID number varies between individual semiconductor devices. However, since the ROM is generally manufactured by photolithography, in order to vary the individual data such as the ID number between the individual semiconductor devices, a photomask has to be formed for every semiconductor device. Thus, when the individual data such as the ID numbers are formed to be all different, a heavy burden is imposed on manufacturing cost and the manufacturing process.

The ID number is a number for identifying each semiconductor device, and each semiconductor device has a different ID number.

In consideration of such a situation, the present invention provides semiconductor devices capable of wireless communication each using an IC provided with a ROM having individual data such as an ID number that is different from those of other semiconductor device, and a manufacturing method of the semiconductor devices.

In order to solve the above-described problems, in semiconductor devices capable of communication via wireless communication according to the present invention, one feature is that a wiring is soaked in an electrolyte and applied with a voltage, thereby dissolving a wiring material. Thus, a wiring whose electric connection is blocked and a wiring whose electric connection is maintained are formed, and different data is written to each of the semiconductor devices.

More specifically, among electrodes or wirings which are electrically connected to active layers of TFTs for forming a memory cell array of a memory circuit in a semiconductor device, an electrode or wiring whose electric connection is desired to be blocked is soaked in an electrolyte and applied with a voltage, thereby dissolving the electrode or wiring. In this manner, an electrode or wiring whose electric connection is blocked and an electrode or wiring whose electric connection is maintained can be separately formed.

In the present invention, the above-described different data to each semiconductor device means individual data such as an ID number corresponding to an individual semiconductor device.

In the semiconductor device (also referred to as an ID chip, an IC chip, an IC tag, an ID tag, a wireless chip, or an RFID) capable of communication via wireless communication of the present invention, a ROM and a logic circuit are formed. Each of the ROM and the logic circuit includes a thin film transistor (TFT).

The present invention relates to a semiconductor device including a thin film transistor over a substrate which includes an island-shaped semiconductor film including a channel forming region, a source region and a drain region, a gate insulating film, and a gate electrode; a first interlayer insulating film over the thin film transistor; a first electrode which is formed over the first interlayer insulating film and electrically connected to one of the source region and the drain region; a second electrode which is formed over the first interlayer insulating film and electrically connected to the other of the source region and the drain region; a second interlayer insulating film formed over the first interlayer insulating film, the first electrode, and the second electrode; a first wiring which is formed on the second interlayer insulating film and electrically connected to one of the first electrode and the second electrode; and a second wiring which is formed on the second interlayer insulating film and not electrically connected to the other of the first electrode and the second electrode. The second wiring is not electrically connected to the other of the first electrode and the second electrode by a separation region which is formed in the second interlayer insulating film.

The present invention relates to a manufacturing method of a semiconductor device, including the steps of forming over a substrate an island-shaped semiconductor film, a gate insulating film, and a gate electrode; adding an impurity imparting one conductivity type into the island-shaped semiconductor film so as to form a channel forming region, a source region, and a drain region in the island-shaped semiconductor film; forming a first interlayer insulating film so as to cover the island-shaped semiconductor film, the gate insulating film, and the gate electrode; forming a first electrode which is electrically connected to one of the source region and the drain region, over the first interlayer insulating film; forming a second electrode which is electrically connected to the other of the source region and the drain region, over the first interlayer insulating film; forming a second interlayer insulating film so as to cover the first interlayer insulating film, the first electrode, and the second electrode; forming a first contact hole reaching the first electrode, in the second interlayer insulating film; forming a second contact hole reaching the second electrode, in the second interlayer insulating film; soaking the first electrode and the second electrode in an electrolyte and applying voltage to one of the first electrode and the second electrode so as to dissolve the one of the first electrode and the second electrode and to form a separation region; forming a first wiring which is not electrically connected to the one of the first electrode and the second electrode, in one of the first contact hole and the second contact hole and on the second interlayer insulating film; and forming a second wiring which is electrically connected to the other of the first electrode and the second electrode through the other of the first contact hole and the second contact hole, on the second interlayer insulating film.

In the present invention, the thin film transistor is used in a nonvolatile memory circuit.

The present invention relates to a semiconductor device including a first thin film transistor over a substrate which includes a first island-shaped semiconductor film including a first channel forming region, a first source region and a first drain region, a gate insulating film, and a first gate electrode; a second thin film transistor which includes a second island-shaped semiconductor film including a second channel forming region, a second source region and a second drain region, the gate insulating film, and a second gate electrode; a first interlayer insulating film over the first thin film transistor and the second thin film transistor; a first electrode which is formed over the first interlayer insulating film and electrically connected to one of the first source region and the first drain region; a second electrode which is formed over the first interlayer insulating film and electrically connected to the other of the first source region and the first drain region; a third electrode which is formed over the first interlayer insulating film and electrically connected to one of the second source region and the second drain region; a fourth electrode which is formed over the first interlayer insulating film and electrically connected to the other of the second source region and the second drain region; a second interlayer insulating film formed over the first interlayer insulating film and the first to fourth electrodes; a first wiring which is formed on the second interlayer insulating film and electrically connected to the first electrode; a second wiring which is formed on the second interlayer insulating film and electrically connected to the second electrode; a third wiring which is formed on the second interlayer insulating film and not electrically connected to the third electrode; and a fourth wiring which is formed on the second interlayer insulating film and electrically connected to the fourth electrode. The third wiring is not electrically connected to the third electrode by a separation region which is formed in the second interlayer insulating film.

The present invention relates to a manufacturing method of a semiconductor device, including the steps of forming over a substrate a first island-shaped semiconductor film, a second island-shaped semiconductor film, a gate insulating film, a first gate electrode, and a second gate electrode; adding an impurity imparting one conductivity type into the first island-shaped semiconductor film and the second island-shaped semiconductor film so as to form a first channel forming region, a first source region, and a first drain region in the first island-shaped semiconductor film and so as to form a second channel forming region, a second source region, and a second drain region in the second island-shaped semiconductor film; forming a first interlayer insulating film so as to cover the first island-shaped semiconductor film, the second island-shaped semiconductor film, the gate insulating film, the first electrode, and the second electrode; forming a first electrode which is electrically connected to one of the first source region and the first drain region, over the first interlayer insulating film; forming a second electrode which is electrically connected to the other of the first source region and the first drain region, over the first interlayer insulating film; forming a third electrode which is electrically connected to one of the second source region and the second drain region, over the first interlayer insulating film; forming a fourth electrode which is electrically connected to the other of the second source region and the second drain region, over the first interlayer insulating film; forming a second interlayer insulating film so as to cover the first interlayer insulating film and the first to fourth electrodes; forming a first contact hole reaching the first electrode, in the second interlayer insulating film; forming a second contact hole reaching the second electrode, in the second interlayer insulating film; forming a third contact hole reaching the third electrode, in the second interlayer insulating film; forming a fourth contact hole reaching the fourth electrode, in the second interlayer insulating film; soaking the first to fourth electrodes in an electrolyte and applying voltage to the third electrode so as to dissolve the third electrode and form a separation region; forming a first wiring which is electrically connected to the first electrode through the first contact hole, on the second interlayer insulating film; forming a second wiring which is electrically connected to the second electrode through the second contact hole, on the second interlayer insulating film; forming a third wiring which is not electrically connected to the third electrode, in the third contact hole and on the second interlayer insulating film; and forming a fourth wiring which is electrically connected to the fourth electrode through the fourth contact hole, on the second interlayer insulating film.

In the present invention, the first thin film transistor and the second thin film transistor are used in a nonvolatile memory circuit.

Note that in this specification, a semiconductor device refers to all types of devices which can function by using semiconductor characteristics. An electro-optical device, a semiconductor circuit, and an electronic device are all included in the category of the semiconductor device.

By the present invention, different individual data such as ID numbers can be easily given to individual semiconductor devices capable of wireless communication that use ICs.

In this way, reduction of manufacturing time and manufacturing cost of a semiconductor device capable of wireless communication that uses an IC can be realized.

BRIEF DESCRIPTION OF DRAWINGS

In the accompanying drawings:

FIGS. 5A to 5C are cross sectional views of a manufacturing process of a semiconductor device according to the present invention;

FIGS. 6A to 6C are cross sectional views of a manufacturing process of a semiconductor device of the present invention;

FIGS. 7A to 7C are cross sectional views of a manufacturing process of a semiconductor device of the present invention;

FIGS. 8A and 8B are cross sectional views of a manufacturing process of a semiconductor device of the present invention;

FIGS. 9A and 9B are cross sectional views of a manufacturing process of a semiconductor device of the present invention;

FIGS. 16A to 16D are cross sectional views of a manufacturing process of a semiconductor device according to the present invention;

FIGS. 17A to 17C are cross sectional views of a manufacturing process of a semiconductor device according to the present invention;

FIGS. 18A to 18C are cross sectional views of a manufacturing process of a semiconductor device according to the present invention;

FIGS. 21A and 21B are cross sectional views of a manufacturing process of a semiconductor device according to the present invention;

FIGS. 22A and 22B are cross sectional views of a manufacturing process of a semiconductor device according to the present invention;

DETAILED DESCRIPTION OF THE INVENTION

Embodiment Mode 1

Figure 1:
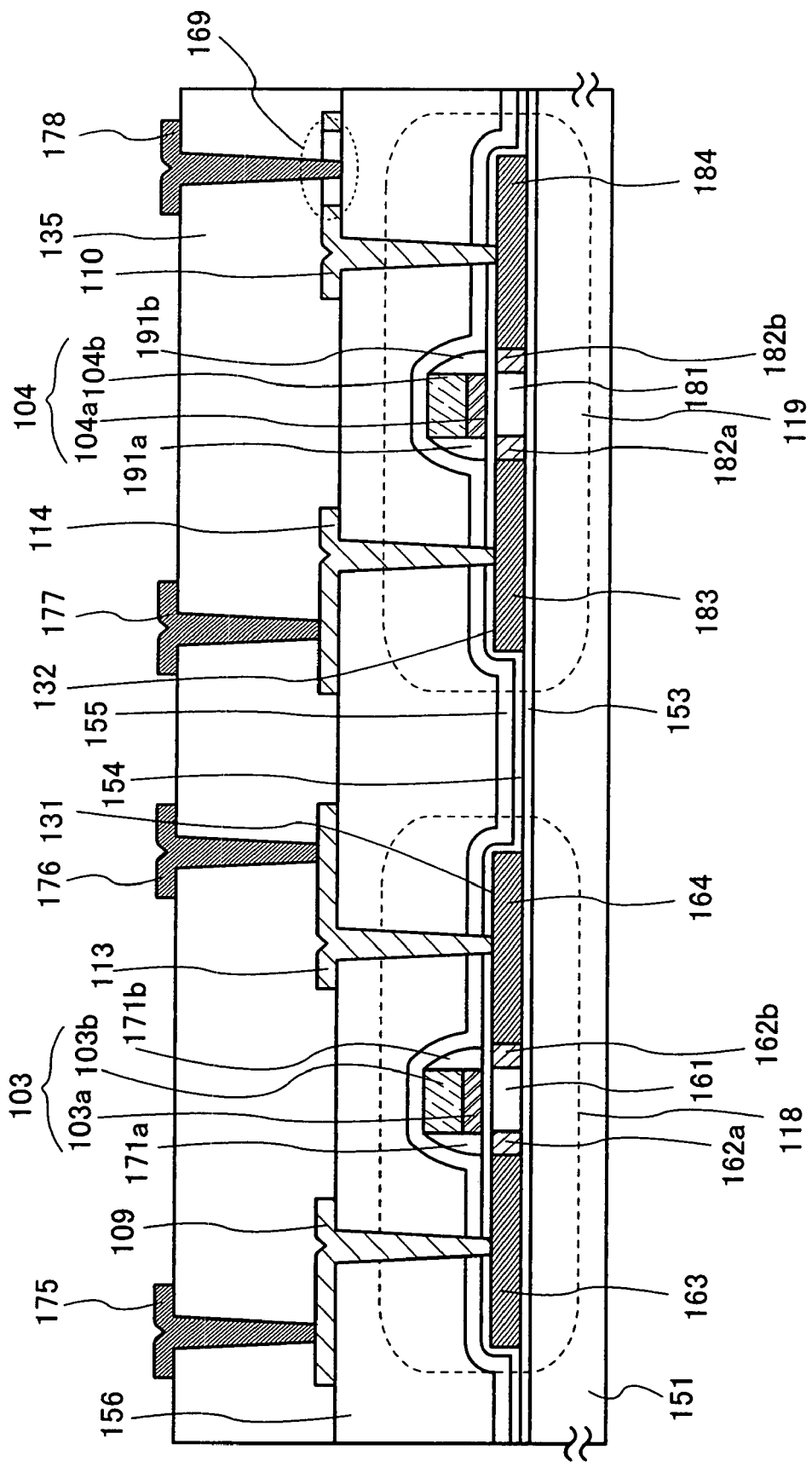
FIG. 1 is a cross sectional view of a semiconductor device according to the present invention.

Embodiment modes and embodiments of the present invention will be described with reference to the drawings. It is easily understood by those skilled in the art that various changes may be made in forms and details without departing from the spirit and the scope of the invention. Therefore, the present invention should not be limited to the descriptions of the embodiment modes and embodiments below. In addition, in the following drawings, the same reference numerals are commonly given to the same components or components having a similar function, and the repetitive description thereof is omitted.

Embodiment Mode 1 will be described with reference to FIG. 1, FIGS. 5A to 5C, FIGS. 6A to 6C, FIGS. 7A to 7C, FIGS. 8A and 8B, FIGS. 9A and 9B, FIG. 10, FIG. 11, FIG. 12, FIG. 13, FIG. 14, and FIG. 15.

Figure 10:
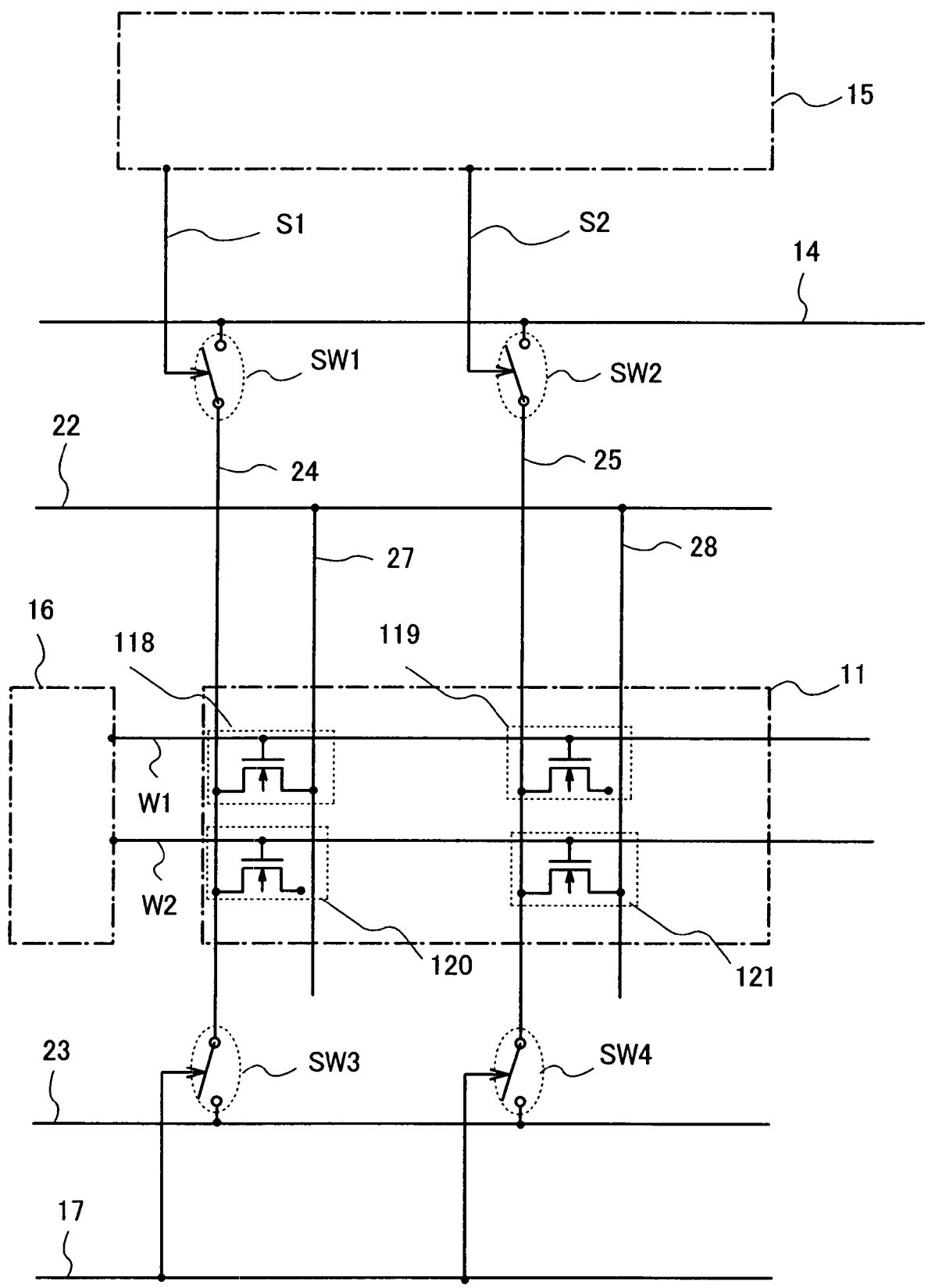
FIG. 10 is a circuit diagram of a semiconductor device according to the present invention.

FIG. 10 is a circuit diagram of a mask ROM and includes a column decoder 15, a row decoder 16, a memory cell array 11 including n-channel TFTs 118 to 121, bit lines (data lines) 24 and 25, word lines W1 and W2, a high voltage power supply (VDD) 22, a low voltage power supply (VSS or GND) 23, column switches SW1 to SW4, address lines S1 and S2 which are controlled by the column decoder 15, an output line 14, a control line 17, and wirings 27 and 28 which are electrically connected to the high voltage power supply 22.

FIG. 1 is a cross sectional view of the TFT 118 and the TFT 119 included in the memory cell array 11 shown in FIG. 10. The storage state of the mask ROM shown in FIG. 1 is expressed by whether a wiring is electrically connected to the other of a source region and a drain region of a TFT for forming a memory cell which is formed in the mask ROM. The TFT 118 is electrically connected to the wiring 27, and the TFT 119 is not electrically connected to the wiring 28.

For simplicity, FIG. 10 shows a memory cell array for 4 bits. However, a nonvolatile memory circuit of the present invention is not limited to 4 bits.

In FIGS. 1 and 10, the TFTs 118 to 121 are n-channel TFTs, and the TFT 118 includes an island-shaped semiconductor film 131, which is an active layer, and a gate electrode 103 including a lower-layer gate electrode 103a and an upper-layer gate electrode 103b as shown in FIG. 1. The TFT 119 includes an island-shaped semiconductor film 132, which is an active layer, and a gate electrode 104 including a lower-layer gate electrode 104a and an upper-layer gate electrode 104b.

The gate electrodes 103 and 104 are electrically connected to the word line W1. Note that each of TFT 120 and the TFT 121 shown in FIG. 10 has the same structure as that of any of the TFT 118 and the TFT 119, and gate electrodes of the TFTs 120 and 121 are electrically connected to the word line W2.

One of a source region and a drain region of the TFT 118 and one of a source region and a drain region of the TFT 120 are electrically connected to the bit line 24 (which corresponds to a wiring 175). Further, one of a source region and a drain region of the TFT 119 and one of a source region and a drain region of the TFT 121 are electrically connected to the bit line 25 (which corresponds to a wiring 177).

The other of the source region and the drain region of each of the TFTs 118 to 121 is electrically connected to the high voltage power supply 22 through the wiring 27 (which corresponds to a wiring 176) or the wiring 28 (which corresponds to a wiring 178) according to need. The storage state of the mask ROM is determined depending on whether or not it is electrically connected to the high voltage power supply 22.

As shown in FIG. 1, the TFT 118 is formed over a base film 153, which is formed over a substrate 151. The TFT 118 includes the island-shaped semiconductor film 131, a gate insulating film 154, the gate electrode 103 including the lower-layer gate electrode 103a and the upper-layer gate electrode 103b, and sidewalls 171a and 171b. The island-shaped semiconductor film 131 includes a region 163, which is one of the source region and the drain region; a region 164, which is the other of the source region and the drain region; low-concentration impurity regions 162a and 162b; and a channel forming region 161.

The TFT 119 is formed over the base film 153, which is formed over the substrate 151. The TFT 119 includes the island-shaped semiconductor film 132, the gate insulating film 154, the gate electrode 104 including the lower-layer gate electrode 104a and the upper-layer gate electrode 104b, and sidewalls 191a and 191b. The island-shaped semiconductor film 132 includes a region 184, which is one of the source region and the drain region; a region 183, which is the other of the source region and the drain region; low-concentration impurity regions 182a and 182b; and a channel forming region 181.

In FIG. 1, the base film 153 has one layer; however, the number of layers may be determined as needed.

Over the TFTs 118 and 119, a first interlayer insulating film 155 is formed, and further, a second interlayer insulating film 156 is formed thereover.

Note that each of the TFTs 120 and 121 has a cross sectional structure similar to either of the TFT 118 or the TFT 119.

Over the second interlayer insulating film 156, an electrode 109 for electrically connecting to the region 163, an electrode 113 for electrically connecting to the region 164, an electrode 114 for electrically connecting to the region 183, and an electrode 110 for electrically connecting to the region 184 are formed. Each of the electrode 109 and the electrode 113 serves as the source electrode or the drain electrode of the TFT 118, and each of the electrode 114 and the electrode 110 serves as the source electrode or the drain electrode of the TFT 119.

Note that after formation of the electrode 110, the electrode 110 is soaked in an electrolyte while being applied with a voltage, thereby being etched partially. Accordingly, the electrode 110 is not electrically connected to the wiring 178 which is formed in a later step.

A third interlayer insulating film 135 is formed over the second interlayer insulating film 156, the electrode 109, the electrode 113, the electrode 114, and the electrode 110.

Over the third interlayer insulating film 135, the wiring 175 (which corresponds to the bit line 24), the wiring 177 (which corresponds to the bit line 25), the wiring 176 (which corresponds to the wiring 27), and the wiring 178 (which corresponds to the wiring 28) are formed. The wiring 175 (bit line 24) is electrically connected to the electrode 109, the wiring 177 (bit line 25) is electrically connected to the electrode 114, and the wiring 176 (wiring 27) is connected to the electrode 114. Since the wiring 178 (wiring 28) is separated from the electrode 110 as described above, the wiring 178 is not electrically connected to the electrode 110.

Figure 11:
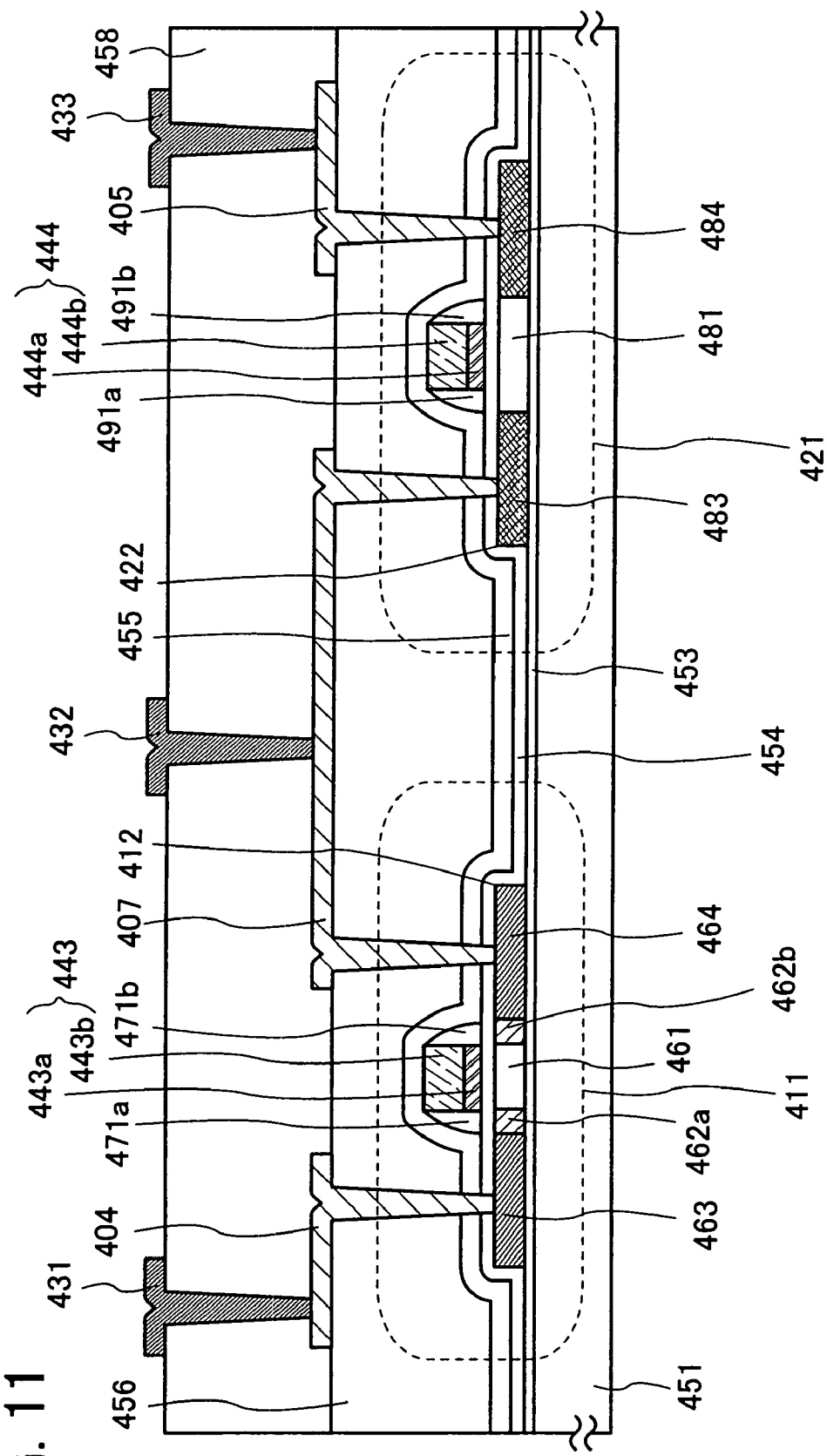
FIG. 11 is a cross sectional view of a semiconductor device according to the present invention.
Figure 12:
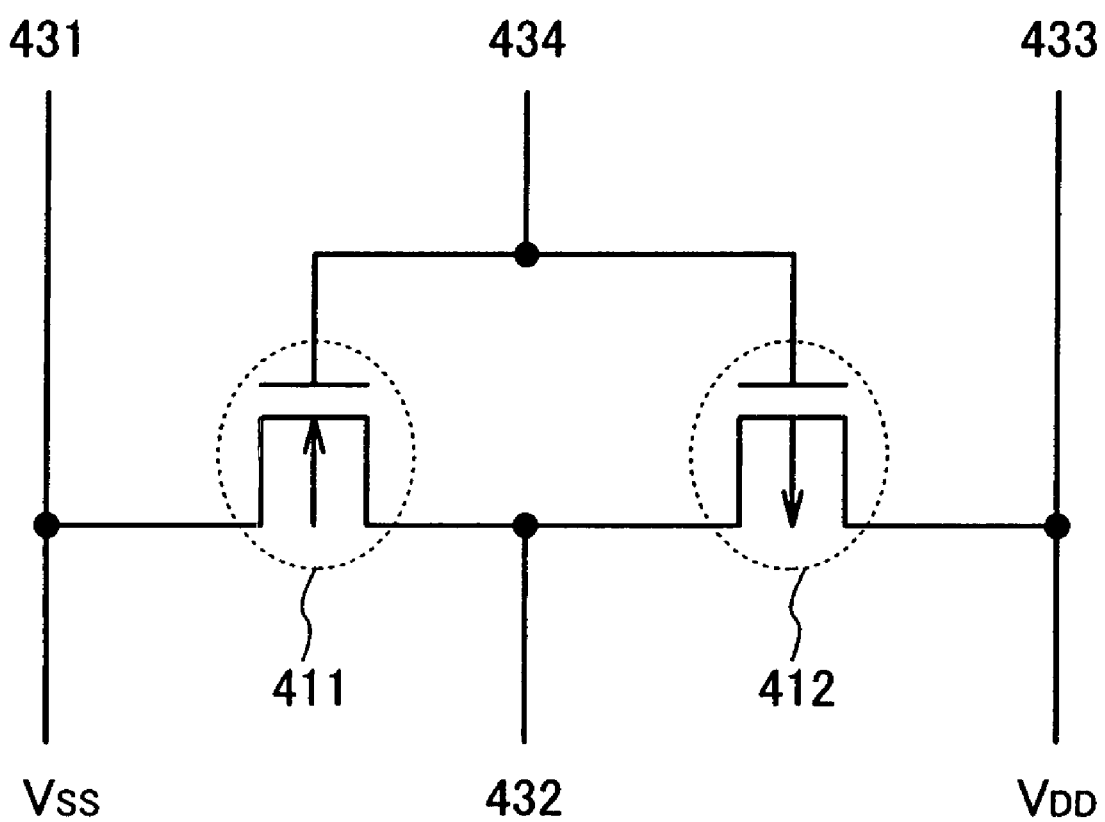
FIG. 12 is a circuit diagram of a semiconductor device according to the present invention.

FIG. 11 is a cross sectional view of a TFT of a logic circuit for controlling a mask ROM, and FIG. 12 is a circuit diagram of the logic circuit. The basic configuration of the logic circuit is a CMOS circuit in which an n-channel TFT and a p-channel TFT are connected complementarily. A column decoder and a row decoder to be described later are formed using such a CMOS circuit. FIG. 11 and FIG. 12 show an inverter using a CMOS circuit.

In FIG. 11 and FIG. 12, a gate electrode 443 and a gate electrode 444 are formed using the same material and the same process. A wiring 407, a wiring 404, and a wiring 405 are formed using the same material and the same process. Further, a power supply line 431, a wiring 432, and a power supply line 433 are formed using the same material and the same process. However, they may certainly be formed using different materials and different processes according to need.

As shown in FIG. 11, an n-channel TFT 411 is formed over a base film 453 which is formed over a substrate 451. The TFT 411 includes an island-shaped semiconductor film 412 which is an active layer, a gate insulating film 454, a gate electrode 443 including a lower-layer gate electrode 443a and an upper-layer gate electrode 443b, and sidewalls 471a and 471b. The base film 453 has one layer; however, the number of layers may be determined as needed.

The island-shaped semiconductor film 412 includes a channel forming region 461, low-concentration impurity regions 462a and 462b, a region 463 which is one of the source region and the drain region, and a region 464 which is the other of the source region and the drain region.

The region 463 which is one of the source region and the drain region of the TFT 411 is connected to the wiring 404, and the region 464 which is the other of the source region and the drain region of the TFT 411 is connected to the wiring 407.

A p-channel TFT 421 is formed over the base film 453 which is formed over the substrate 451. The TFT 421 includes an island-shaped semiconductor film 422 which is an active layer, the gate insulating film 454, a gate electrode 444 including a lower-layer gate electrode 444a and an upper-layer gate electrode 444b, and sidewalls 491a and 491b.

The island-shaped semiconductor film 422 includes a channel forming region 481, a region 484 which is one of the source region and the drain region, and a region 483 which is the other of the source region and the drain region.

The region 484 which is one of the source region and the drain region of the TFT 421 is connected to the wiring 405, and the region 483 which is the other of the source region and the drain region of the TFT 421 is connected to the wiring 407.

In this embodiment mode, although a low concentration impurity region is not formed in the p-channel TFT 421, it may be formed according to need.

The wiring 407 electrically connects the region 464 which is the other of the source region and the drain region of the n-channel TFT 411 to the region 483 which is the other of the source region and the drain region of the p-channel TFT 421.

Over the TFTs 411 and 421, a first interlayer insulating film 455 and a second interlayer insulating film 456 are formed.

The wiring 404, the wiring 405, and the wiring 407 are formed over the second interlayer insulating film 456, and the wiring 404 is electrically connected to the region 463. The wiring 405 is electrically connected to the region 484. The wiring 407 is electrically connected to the region 464 and the region 483.

A third interlayer insulating film 458 is formed over the second interlayer insulating film 456, the wiring 404, the wiring 405, and the wiring 407.

The power supply line 431 electrically connected to the wiring 404, the power supply line 433 electrically connected to the wiring 405, and the wiring 432 electrically connected to the wiring 407 are formed over the third interlayer insulating film 458. The wiring 432 serves as an output terminal of the inverter. Further, a wiring 434 electrically connected to the gate electrode 443 and the gate electrode 444 is formed, and the wiring 434 serves as an input terminal of the inverter.

The operation of the mask ROM using the present invention formed in the above-described process will be described with reference to FIG. 10. Note that the circuit configuration and the operation are not limited to the following descriptions as long as it is a circuit capable of reading individual data such as an ID number that is stored in or written to a memory cell. Further, for simple description, FIG. 10 shows operation of a memory cell for 2 bits, taking a 4-bit mask ROM as an example. However, the bit number and operation of the mask ROM is not limited to this description, the present invention is applicable in the case of a larger number of bits, and data of a memory cell for all bits is read out.

As shown in FIG. 10, the mask ROM using the present invention includes the column decoder 15, the row decoder 16, the memory cell array 11 including the n-channel TFTs 118 to 121, the bit lines (data lines) 24 and 25, the word lines W1 and W2, the high voltage power supply (VDD) 22, the low voltage power supply (VSS or GND) 23, the column switches SW1 to SW4, the address lines S1 and S2 which are controlled by the column decoder 15, the output line 14, and the control line 17.

First, the operation of precharging a potential of the low voltage power supply (VSS or GND) using a quarter of a reading time, in reading individual data such as an ID number which is stored in or written to a 1-bit memory cell, will be described.

The control line 17 is in a state of selecting the SW3 and the SW4 for a quarter of a reading time, and sends a signal for electrically connecting the bit lines (data lines) 24 and 25 to the low voltage power supply (VSS or GND) 23. Thus, each of the bit lines (data lines) 24 and 25 obtains a potential of the low voltage power supply (VSS or GND).

At this time, the word lines W1 and W2 are not in a state of selecting the n-channel TFTs 118 to 121. Here, the selecting state indicates a state of electrically connecting a source terminal to a drain terminal of the n-channel TFTs 118 to 121.

The address lines S1 and S2, which are controlled by the column decoder 15, are also not in a state of selecting the column switches SW1 and SW2. Here, the selecting state indicates a state of electrically connecting the bit lines (data lines) 24 and 25 to the output line 14.

Regarding a voltage to be precharged, depending on the circuit configuration, the system, the logic, or the like, there are various cases such as a case of precharging a potential of the low voltage power supply (VSS or GND) as the present invention, a case of precharging a potential of the high voltage power supply (VDD), and a case of precharging a potential of a generation voltage other than the foregoing, and there is no limitation. The most appropriate voltage may be selected depending on the case.

Next, the operation of reading the individual data such as an ID number from the mask ROM using the present invention, using the other three-fourths of the reading time, will be described. Here, in the case where a voltage having the same level as the high voltage power supply (VDD) is output, the read individual data such as an ID number is considered as High, and in the case where a voltage having the same level as the low voltage power supply (VSS or GND) is output, the read individual data is considered as Low. Whether the read individual data such as the ID number is High or Low depends on the circuit configuration, the system, the logic, and the like, and not limited to this description.

When the word line W1 is selected by the row decoder 16 and the address line S1 is selected by the column decoder 15, the n-channel TFT 118 is selected. Then, the source terminal and the drain terminal of the n-channel TFT 118 are electrically connected. That is, the bit line (data line) 24 and the high voltage power supply (VDD) 22, which are the source terminal and the drain terminal of the n-channel TFT 118, are electrically connected. The bit line is charged to a voltage which is a threshold amount of the n-channel TFT 118 lower than the voltage of the high voltage power supply (VDD) 22. Further, since the address line S1 is selected by the column decoder 15, the bit line (data line) 24 and the output line 14 are electrically connected. Here, since the bit line is charged to a voltage which is a threshold amount of the n-channel TFT 118 lower than the voltage of the high voltage power supply (VDD) 22, the output line 14 has the same potential as the bit line (data line) 24. That is, a voltage which is a threshold amount of the n-channel TFT 118 lower than the voltage of the high voltage power supply (VDD) 22 is output to the output line 14.

Although not shown, the voltage which is a threshold amount of the n-channel TFT 118 lower than the voltage of the high voltage power supply (VDD) 22 is made to pass through an amplifier, thereby a potential the same as that of the high voltage power supply (VDD) is output. Here, the amplifier is a circuit capable of increasing a voltage or a current, and may have a structure where two stages of inverters are connected or a structure using a comparator or the like.

Thus, the High which is the individual data such as the ID number stored in or written to the n-channel TFT 118 is output to the output line 14.

Similarly, when the word line W1 is selected by the row decoder 16 and the address line S2 is selected by the column decoder 15, the n-channel TFT 119 is selected. One terminal of the n-channel TFT 119 is not connected to anywhere; however, by the above-described precharging operation, the bit line (data line) 25, which is the other terminal, has a potential of the low voltage power supply 23 (VSS or GND). That is, the one terminal of the n-channel TFT 119 and the other terminal have almost equal potentials to the potential of the low voltage power supply (VSS or GND) 23. Further, since the address line S2 is selected by the column decoder 15, the bit line (data line) 25 and the output line 14 are electrically connected. That is, a potential almost equal to that of the low voltage power supply (VSS or GND) 23 is output to the output line 14.

Thus, the Low which is the individual data such as the ID number stored in or written to the n-channel TFT 119 is output to the output line 14.

In the above-described manner, the individual data such as the ID number stored in or written to the mask ROM using the present invention can be read out.

A process for manufacturing a TFT of a memory cell array will be described below with reference to FIGS. 5A to 5C, FIGS. 6A to 6C, FIGS. 7A to 7C, FIGS. 8A and 8B, and FIGS. 9A and 9B.

First, as shown in FIG. 5A, a base film 153 is formed over a substrate 151. As the substrate 151, a glass substrate of barium borosilicate glass, alumino borosilicate glass, or the like, a quartz substrate, a stainless-steel substrate, an SOI (Silicon on Insulator) substrate which is formed by formation of a single crystalline semiconductor layer on an insulating surface, or the like can be used. Also, a substrate including a synthetic resin having flexibility such as acrylic or plastic represented by poly(ethylene terephthalate) (PET), poly (ether sulfone) (PES), or poly(ethylene Naphthalate) (PEN) can be used. A case of using a glass substrate as the substrate 151 will be described below.

The base film 153 is provided to prevent an alkali metal such as Na or an alkaline earth metal contained in the substrate 151 from diffusing into a semiconductor film and causing an adverse effect on a characteristic of a semiconductor element. Therefore, the base film 153 is formed using an insulating film of silicon nitride, silicon oxide containing nitrogen, or the like which can suppress diffusion of the alkali metal or alkaline earth metal into the semiconductor film. In this embodiment mode, the base film 153 is formed by a plasma CVD method by stacking a silicon oxide film and a silicon oxide film containing nitrogen so that thicknesses thereof are 10 to 100 nm (preferably 20 to 70 nm, more preferably 50 nm) and 10 to 400 nm (preferably 50 to 300 nm, more preferably 100 nm), respectively.

Note that the base film 153 may be a single layer of an insulating film containing silicon nitride, silicon oxide containing nitrogen, silicon nitride containing oxygen, or a stack of layers of a plurality of insulating films of silicon oxide, silicon nitride, silicon oxide containing nitrogen, silicon nitride containing oxygen, or the like. Further, in a case of using a substrate containing an alkali metal or alkaline earth metal in any amount such as a glass substrate, a stainless-steel substrate, or a plastic substrate, it is effective to provide a base film in terms of preventing diffusion of an impurity; however, if diffusion of an impurity is not much of a problem as in a case of using a quartz substrate, it is not always necessary to provide a base film.

Next, a semiconductor film 101 is formed over the base film 153. The thickness of the semiconductor film 101 is set at 25 to 100 nm (preferably, 30 to 80 nm). Note that the semiconductor film 101 may be an amorphous semiconductor or a polycrystalline semiconductor. Also, silicon germanium (SiGe) can be used as well as silicon (Si) as a semiconductor. In a case of using silicon germanium, the concentration of germanium is preferably about 0.01 to 4.5 atomic %. In this embodiment mode, an amorphous silicon film is formed to have a thickness of 66 nm as the semiconductor film 101.

Next, a linear beam 111 is emitted to the semiconductor film 101 from a laser irradiation apparatus to carry out crystallization, as shown in FIG. 5B.

In the case of carrying out laser crystallization, the semiconductor film 101 may be subjected to heating treatment at 500° C. for one hour before laser crystallization, in order to increase resistance of the semiconductor film 101 against a laser beam.

For the laser crystallization, a continuous wave laser or a pulsed laser with a repetition rate of 10 MHz or more, preferably 80 MHz or more as a pseudo CW laser can be used.

Specifically, the following and the like can be given as examples of the continuous wave laser: an Ar laser, a Kr laser, a $CO_2$ laser, a YAG laser, a $YVO_4$ laser, a forsterite ($Mg_2SiO_4$) laser, a YLF laser, a $YAlO_3$ laser, a $GdVO_4$ laser, a $Y_2O_3$ laser, an alexandrite laser, a Ti:sapphire laser, a helium cadmium laser, and a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Also, as the pseudo CW laser, a pulsed laser such as the following can be used if pulse oscillation at a repetition rate of 10 MHz or more, preferably 80 MHz or more, is possible: an Ar laser, a Kr laser, an excimer laser, a $CO_2$ laser, a YAG laser, a $Y_2O_3$ laser, a $YVO_4$ laser, a forsterite ($Mg_2SiO_4$) laser, a YLF laser, $YAlO_3$ laser, a $GdVO_4$ laser, an alexandrite laser, a Ti:sapphire laser, a copper vapor laser, a gold vapor laser, or a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Such a pulsed laser eventually exhibits an effect equivalent to that of a continuous wave laser when the repetition rate is increased.

For example, in a case of using a solid-state laser capable of continuous oscillation, a crystal with a large grain diameter can be obtained by irradiation with laser light of a second harmonic to a fourth harmonic. Typically, it is desirable to use a second harmonic (532 nm) or a third harmonic (355 nm) of the YAG laser (fundamental wave of 1064 nm). For example, laser light emitted from a continuous wave YAG laser is converted to a high harmonic by a nonlinear optical element, and emitted to the semiconductor film 604. The power density may be about 0.01 to 100 $MW/cm^2$ (preferably 0.1 to 10 $MW/cm^2$). Then, irradiation is carried out with a scanning speed of about 10 to 2000 cm/sec.

Note that a laser of which a medium is a single-crystalline YAG, $YVO_4$, forsterite ($Mg_2SiO_4$), $YAlO_3$, or $GdVO_4$ doped with one or more of Nd, Yb, Cr, Ti, Ho, Er, Tm, and Ta as a dopant, or a polycrystalline (ceramic) YAG, $Y_2O_3$, $YVO_4$, $YAlO_3$, or $GdVO_4$, doped with one or more of Nd, Yb, Cr, Ti, Ho, Er, Tm, and Ta as a dopant; an Ar laser; a Kr laser; or a Ti:sapphire laser is capable of continuous oscillation, and also capable of pulse oscillation by carrying out a Q switch operation, mode locking, or the like. When a laser beam is oscillated at a repetition rate of 10 MHz or more, the semiconductor film is irradiated with a subsequent pulse while the semiconductor film is melted by a preceding laser and then solidified. Consequently, since a solid-liquid interface in the semiconductor film can be moved continuously unlike in a case of using a pulsed laser with a low repetition rate, crystal grains that continuously grow toward a scanning direction can be obtained.

When ceramics (polycrystals) are used for a medium, the medium can be formed into a free shape in a short amount of time and at low cost. When single crystals are used, a column-shaped medium with several mm in diameter and several tens of mm long is usually used, but a larger medium can be formed when ceramic is used.

Since the concentration of a dopant such as Nd or Yb in the medium which directly contributes to light emission cannot be changed significantly in either single crystals or polycrystals, improvement in laser output by increasing the concentration is limited to a certain extent. However, in the case of ceramics, there is a possibility that output can be drastically improved since the size of the medium can be significantly increased compared to single crystals.

Further, in the case of ceramics, a medium having a parallelepiped shape or a rectangular parallelepiped shape can be easily formed. When a medium having such a shape is used and oscillation light travels in a zigzag in the medium, an oscillation light path can be longer. Accordingly, amplification is increased and oscillation with high output becomes possible. Since a laser beam emitted from the medium having such a shape has a cross section of a quadrangular shape when being emitted, a linear beam can be easily shaped compared with the case of a circular beam. The laser beam emitted in such a manner is shaped by using an optical system; accordingly, a linear beam having a short side of less than or equal to 1 mm and a long side of several mm to several m can be easily obtained. In addition, by uniformly irradiating the medium with excited light, a linear beam has a uniform energy distribution in a long side direction.

By irradiation of the semiconductor film with this linear beam, the entire surface of the semiconductor film can be annealed more uniformly. In the case where uniform annealing is required from one end to the other end of the linear beam, slits may be provided for the ends so as to shield a portion where energy is attenuated from light.

By irradiating the semiconductor film 101 with laser light as mentioned above, a crystalline semiconductor film 102 with improved crystallinity is formed.

Next, as shown in FIG. 5C, the crystalline semiconductor film 102 is used to form island-shaped semiconductor films 131 and 132. These island-shaped semiconductor films 131 and 132 serve as active layers of TFTs to be formed in a subsequent process.

In this embodiment mode, the case of using a glass substrate as the substrate 151 is described; however, in the case of using an SOI substrate as the substrate 151, a single-crystalline semiconductor layer may be formed into an island shape to serve as an active layer of a TFT.

Next, an impurity is introduced into the island-shaped semiconductor films 131 and 132 for controlling threshold voltages. In this embodiment mode, boron (B) is introduced into the island-shaped semiconductor films 131 and 132 by doping of diborane ($B_2H_6$).

Next, a gate insulating film 154 is formed over the island-shaped semiconductor films 131 and 132. For the gate insulating film 154, silicon oxide, silicon nitride, silicon oxide containing nitrogen, or the like with a film thickness of 10 to 110 nm can be used, for example. Also, as a film formation method, a plasma CVD method, a sputtering method, or the like can be used. In this embodiment mode, the gate insulating film 154 is formed using a silicon oxide film containing nitrogen that is formed by a plasma CVD method to have a film thickness of 20 nm.

Next, a first conductive film 115 and a second conductive film 116 are formed over the gate insulating film 154 (FIG. 6A).

An element selected from tantalum (Ta), tungsten (W), titanium (Ti), molybdenum (Mo), or aluminum (Al); or an alloy material or compound material mainly containing the element as its main component may be used for the first conductive film 115 and the second conductive film 116. Alternatively, the conductive films may be formed using a semiconductor film typified by a polycrystalline silicon film doped with an impurity element such as phosphorus (P).

In this embodiment mode, stacked films are formed using a tantalum nitride (TaN) film with a thickness of 10 to 50 nm, for example, 30 nm, which is formed as the first conductive film 115, and a tungsten (W) film with a thickness of 200 to 400 nm, for example, 370 nm, which is formed as the second conductive film 116.

Then, the first conductive film 115 and the second conductive film 116 are etched so that lower-layer gate electrodes 103a and 104a are formed from the first conductive film 115 and upper-layer gate electrodes 103b and 104b are formed from the second conductive film 116. Accordingly, a gate electrode 103 including the lower-layer gate electrode 103a and the upper-layer gate electrode 103b, and a gate electrode 104 including the lower-layer gate electrode 104a and the upper-layer gate electrode 104b are formed (FIG. 6B). The gate electrodes 103 and 104 may each be a single layer film instead of stacked-layer films.

The gate electrodes 103 and 104 may be formed as a portion of a gate wiring. Alternatively, a gate wiring may be separately formed, and then the gate electrodes 103 and 104 may be connected to the gate wiring.

Next, an impurity imparting one conductivity type is added to the island-shaped semiconductor films 131 and 132. As the impurity imparting one conductivity type, phosphorus (P) or arsenic (As) may be used when using an impurity imparting n-type conductivity. When using an impurity imparting p-type conductivity, boron (B) may be used.

In this embodiment mode, first, as a first adding step, an impurity imparting n-type conductivity is added to the island-shaped semiconductor films 131 and 132 (FIG. 6C). Specifically, phosphorus (P) is introduced into the island-shaped semiconductor films 131 and 132 using phosphine ($PH_3$), with an application voltage of 40 to 120 keV, and a dose amount of $1\times10^{13}$ to $1\times10^{15}$ cm$^{-2}$. In this embodiment mode, phosphorus is added into the island-shaped semiconductor films 131 and 132 using phosphine, with an application voltage of 60 keV and a dose amount of $2.6\times10^{-13}$ cm$^{-2}$. In this manner, impurity regions 125 to 128 are formed. Further, at the time of this introduction of the impurity, regions to be channel forming regions 161 and 181 are determined.

Then, insulating films, i.e. sidewalls 171 and 191, are formed so as to cover side surfaces of the gate electrodes 103 and 104, as shown in FIG. 7A. In other words, the sidewalls 171 (171a and 171b) are formed on the side surfaces of the gate electrode 103, and the sidewalls 191 (191a and 191b) are formed on the side surfaces of the gate electrode 104.

The sidewalls 171 and 191 can be formed from an insulating film including silicon by a plasma CVD method or a low pressure CVD (LPCVD) method. In this embodiment mode, taper-shaped sidewalls 171 and 191 are formed by formation of a silicon oxide film with a film thickness of 50 to 200 nm, preferably 100 nm by a plasma CVD method, and etching of the silicon oxide film. Alternatively, the sidewalls 171 and 191 may be formed using a silicon oxide film containing nitrogen.

Also, end portions of the sidewalls 171 and 191 need not necessarily have a taper shape, and they may have a rectangular shape.

Further, as a second adding step, phosphorus (P) is introduced into the island-shaped semiconductor films 131 and 132 using phosphine ($PH_3$), with an application voltage of 10 to 50 keV, for example 20 keV, and a dose amount of $5.0 \times 10^{14}$ to $2.5 \times 10^{16}$ $cm^{-2}$, for example $3.0 \times 10^{15}$ $cm^{-2}$.

As the second adding step, using the gate electrode 103 and the sidewalls 171 as masks, phosphorus is introduced into the island-shaped semiconductor film 131; accordingly, a region 163, which is one of a source region and a drain region, a region 164 which is the other of the source region and the drain region, and low-concentration impurity regions 162a and 162b are formed in the island-shaped semiconductor film 131. Similarly, using the gate electrode 104 and the sidewalls 191 as masks, phosphorus is introduced into the island-shaped semiconductor film 132, and a region 183, which is one of a source region and a drain region, a region 184, which is the other of the source region and the drain region, and low-concentration impurity regions 182a and 182b are formed in the island-shaped semiconductor film 132.

In this embodiment mode, phosphorus (P) is included in the regions 163 and 164, which are the source region and the drain region of an n-channel TFT 118, and the regions 183 and 184, which are the source region and the drain region of an n-channel TFT 119, at a concentration of $1 \times 10^{19}$ to $5 \times 10^{21}$ $cm^{-3}$.

Also, phosphorus (P) is included at a concentration of $1 \times 10^{18}$ to $5 \times 10^{19}$ $cm^{-3}$ in the low-concentration impurity regions 162a and 162b of the n-channel TFT 118 and the low-concentration impurity regions 182a and 182b of the n-channel TFT 119.

Next, a first interlayer insulating film 155 is formed so as to cover the island-shaped semiconductor films 131 and 132, the gate insulating film 152, the gate electrodes 103 and 104, and the sidewalls 171 and 191 (FIG. 7C).

As the first interlayer insulating film 155, an insulating film containing silicon, for example, a silicon oxide film, a silicon nitride film, or a silicon oxide film containing nitrogen, or a stacked film thereof is formed by a plasma CVD method or a sputtering method. Of course, the first interlayer insulating film 155 is not limited to the silicon oxide film containing nitrogen, the silicon nitride film, or the stacked film thereof, and other insulating film containing silicon may be used in a single-layer or stacked-layer structure.

In this embodiment mode, a silicon oxide film containing nitrogen is formed to have a thickness of 50 nm by a plasma CVD method, and an impurity is activated by a laser irradiation method. Alternatively, after forming the silicon oxide film containing nitrogen, the impurity may be activated by heating in a nitrogen atmosphere at 550° C. for four hours.

Next, a silicon nitride film is formed to have a thickness of 100 nm by a plasma CVD method, and a silicon oxide film is additionally formed to have a thickness of 600 nm. These stacked layers of the silicon oxide film containing nitrogen, the silicon nitride film, and the silicon oxide film are the first interlayer insulating film 155.

Then, the entire substrate is heated at 410° C. for one hour, and hydrogenation is carried out by releasing hydrogen from the silicon nitride film.

Next, a second interlayer insulating film 156 is formed so as to cover the first interlayer insulating film 155.

For the second interlayer insulating film 156, an inorganic material such as an oxide of silicon or nitride of silicon can be used by using a CVD method, a sputtering method, an SOG (Spin On Glass) method, or the like. In this embodiment mode, a silicon oxide film is formed as the second interlayer insulating film 156.

An insulating film using siloxane may be formed as the second interlayer insulating film 156. The siloxane has a skeletal structure including a bond of silicon (Si) and oxygen (O), and an organic group containing at least hydrogen (for example, an alkyl group or aromatic hydrocarbon) is used for a substituent. Alternatively, a fluoro group may be used for the substituent. Further, the organic group containing at least hydrogen and the fluoro group may be used for the substituent.

A passivation film may be formed over the second interlayer insulating film 156. As the passivation film, a film that does not easily allow penetration of moisture, oxygen, and the like compared to other insulating films may be formed. Typically, a silicon nitride film, a silicon oxide film, a silicon nitride film containing oxygen, a silicon oxide film containing nitrogen, a thin film mainly containing carbon (for example, a diamong-like carbon (DLC) film or a carbon nitride (CN) film), or the like which is obtained by a sputtering method or a CVD method, can be used.

Then, over the second interlayer insulating film 156, a conductive film is formed, and using the conductive film, electrodes 109, 113, 114, and 110, which are to be source electrodes and drain electrodes, are formed (FIG. 8A).

The electrode 109, which is one of the source electrode and the drain electrode of the TFT 118, is electrically connected to the region 163, and the electrode 113, which is the other of the source electrode and the drain electrode, is electrically connected to the region 164. The electrode 114, which is one of the source electrode and the drain electrode of the TFT 119, is electrically connected to the region 183, and the electrode 110, which is the other of the source electrode and the drain electrode, is electrically connected to the region 184.

In this embodiment mode, the electrodes 109, 113, 114, and 110 are formed by a CVD method, a sputtering method, or the like using an element such as aluminum (Al), tungsten (W), titanium (Ti), tantalum (Ta), molybdenum (Mo), nickel (Ni), cobalt (Co), iron (Fe), platinum (Pt), copper (Cu), gold (Au), silver (Ag), manganese (Mn), neodymium (Nd), carbon (C), or silicon (Si), or an alloy material or a compound material containing the above element as its main component, with a single layer structure or a stacked structure. An alloy material containing aluminum as its main component corresponds to, for example, a material containing nickel, whose main component is aluminum, or an alloy material containing nickel and one or both of carbon and silicon, whose main component is aluminum. For the electrodes 109, 113, 114, and 110, for example, a stacked structure of a barrier film, an aluminum-silicon (Al—Si) film, and a barrier film, or a stacked structure of a barrier film, an aluminum-silicon (Al—Si) film, a titanium nitride (TiN) film, and a barrier film may be preferably employed. It is to be noted that the barrier film corresponds to a thin film formed using titanium, a nitride of titanium, molybdenum, or a nitride of molybdenum. Aluminum and aluminum silicon which have a low resistance and are inexpensive are optimal materials for forming the electrodes 109, 113, 114, and 110. In addition, an aluminum alloy film can prevent interdiffusion between silicon and aluminum even when being in contact with silicon. In addition, generation of a hillock of aluminum or aluminum silicon can be prevented when upper and lower barrier layers are provided.

In this embodiment mode, the electrodes 109, 113, 114, and 110 are formed using stack layers of a titanium (Ti) film, a titanium nitride film, an aluminum (Al) film, and a titanium (Ti) film, which are 60 nm, 50 nm, 500 nm, and 100 nm, respectively.

The electrodes 109, 113, 114, and 110 may be formed by using the same material and the same process as those of a wiring, or the electrodes and the wiring may be separately formed and then may be connected.

Next, a third interlayer insulating film 135 is formed over the electrode 109, the electrode 113, the electrode 114, the electrode 110, and the second interlayer insulating film 156 or over a passivation film in the case where the passivation film is formed (FIG. 8B). The third interlayer insulating film 135 may be formed of a similar material to that of the second interlayer insulating film 156.

A contact hole 165 reaching the electrode 109, a contact hole 166 reaching the electrode 113, a contact hole 167 reaching the electrode 114, and a contact hole 168 reaching the electrode 110 are formed in the third interlayer insulating film 135 (FIG. 9A).

Then, the whole substrate is soaked in an electrolyte. The electrolyte may be an electrolyte capable of dissolving the material of the electrode 109, the electrode 113, the electrode 114, and the electrode 110. For example, in the case where aluminum is used as the material of the electrode 109, the electrode 113, the electrode 114, and the electrode 110, potassium hydroxide or phosphate can be used as the electrolyte. Note that the object soaked in the electrolyte does not need to be the whole substrate as long as the electrode can be dissolved.

Examples of combinations of the material for forming the electrode 109, the electrode 113, the electrode 114, and the electrode 110 and the electrolyte are shown in Table 1.

TABLE 1

| Metal | Voltage (V) | Current density (A/dm$^2$) | Electrolyte | Temperature (° C.) |
|---|---|---|---|---|
| Aluminum | 30-70 | 30-200 | Potassium hydroxide | 80 |
| Aluminum | 10-40 | 10-100 | Phosphate | 60 |
| Nickel | 40 | 30-60 | Sulfuric acid | 40 |
| Copper | 1.5-2 | 1-10 | Phosphate• Chromic acid | Room temperature |
| Silver | 2-4 | 0.5-3 | Potassium ferrocyanide | Room temperature |

When the electrode 110 is soaked in the electrolyte and is applied with a voltage, metal on a surface of the electrode dissociates as ions into the electrolyte, so that the electrode material is dissolved. As shown in FIG. 9B, a part of the electrode 110 is dissolved so that a separation region 169 is formed. Note that it is preferable that the TFT 119 be a normally-off type TFT at this time to prevent the electrode 109 from being dissolved. Further, the contact hole 165 reaching the electrode 109 may be formed after the separation region 169 is formed.

Then, as shown in FIG. 1, a wiring 175 electrically connected to the electrode 109, a wiring 176 electrically connected to the electrode 113, and a wiring 177 electrically connected to the electrode 114 are formed over the third interlayer insulating film 135.

A wiring 178 is formed over the electrode 110 and the third interlayer insulating film 135. Since the wiring 178 is formed so as to reach the separation region 169, the wiring 178 is not electrically connected to the electrode 110.

The wirings 175 to 178 may be formed of any of the materials for forming the electrode 109 and the like.

In the above-described manner, TFTs of a memory cell array is formed. Note that TFTs of a logic circuit may be formed similarly to the TFTs of the memory cell array, or may be formed over another substrate, separated, and then be electrically connected to the TFTs of the memory cell array.

According to the present invention, memory cells of mask ROMs having data of different ID numbers can be easily formed. Therefore, reduction of manufacturing time and manufacturing cost of a semiconductor device capable of wireless communication that uses an IC can be realized.

Figure 13:
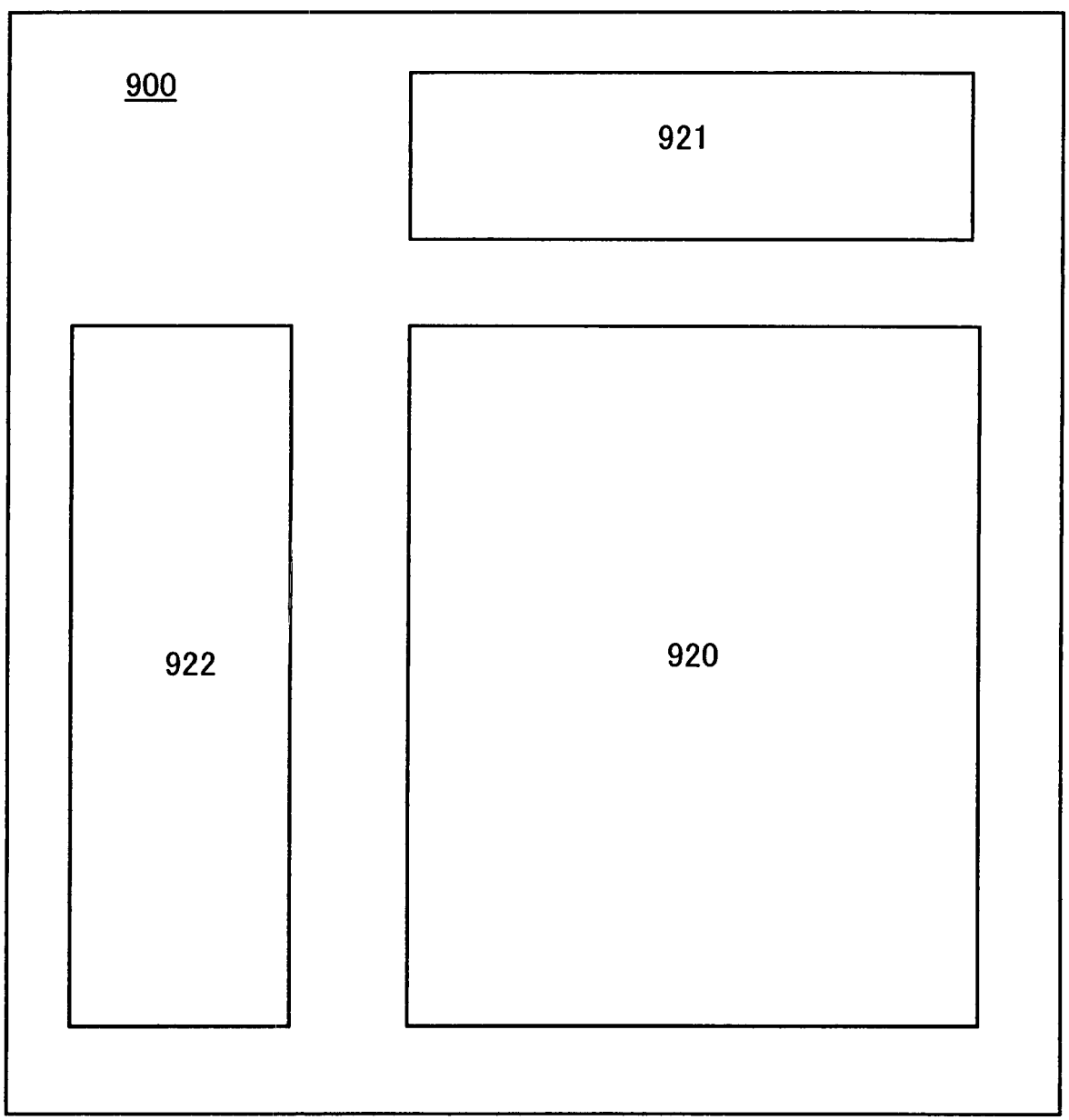
FIG. 13 is a block diagram showing a structure of a semiconductor device according to the present invention.

FIG. 13 is a top view of a mask ROM including a memory cell array according to the present invention. A memory cell array 920 (corresponding to a memory cell array 11 in FIG. 10) of the present invention is formed in a mask ROM 900, and with the use of the above-described TFTs of a logic circuit, a column decoder 921 (a column decoder 15 in FIG. 10) and a row decoder 922 (corresponding to a column decoder 16 in FIG. 10) are formed.

Figure 14:
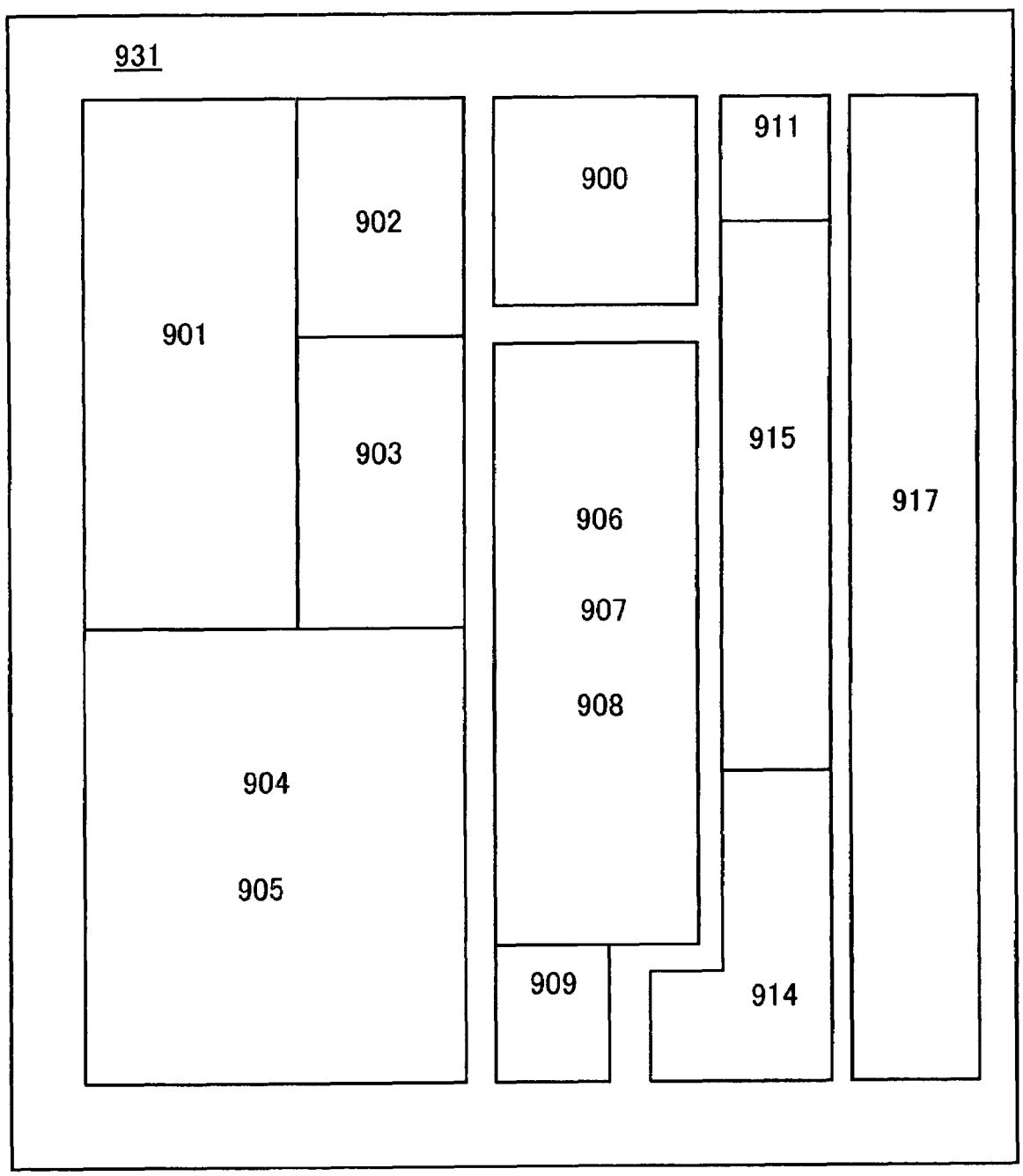
FIG. 14 is a block diagram showing a structure of a semiconductor device according to the present invention.

FIG. 14 shows an example of a semiconductor device capable of wireless communication that uses an IC, which includes the mask ROM 900 of FIG. 13. The semiconductor device shown in FIG. 14 is only an example, and the present invention is not limited to the structure shown in FIG. 14.

A semiconductor device (also referred to as an ID chip, an IC chip, an IC tag, an ID tag, a wireless chip, or an RFID) 931 shown in FIG. 14 includes circuit blocks of an antenna 917, a high-frequency circuit 914, a power supply circuit 915, a reset circuit 911, a rectifier circuit 906, a demodulation circuit 907, an analog amplifier 908, a clock generation circuit 903, a modulation circuit 909, a signal output control circuit 901, a CRC circuit 902, a mask ROM 900, a code extraction circuit 904, and a code identification circuit 905. The power supply circuit 915 includes circuit blocks of a rectifier circuit and a storage capacitor. Further, as shown in FIG. 13, the mask ROM 900 includes the memory cell array 920, the column decoder 921, and the row decoder 922.

Figure 15:
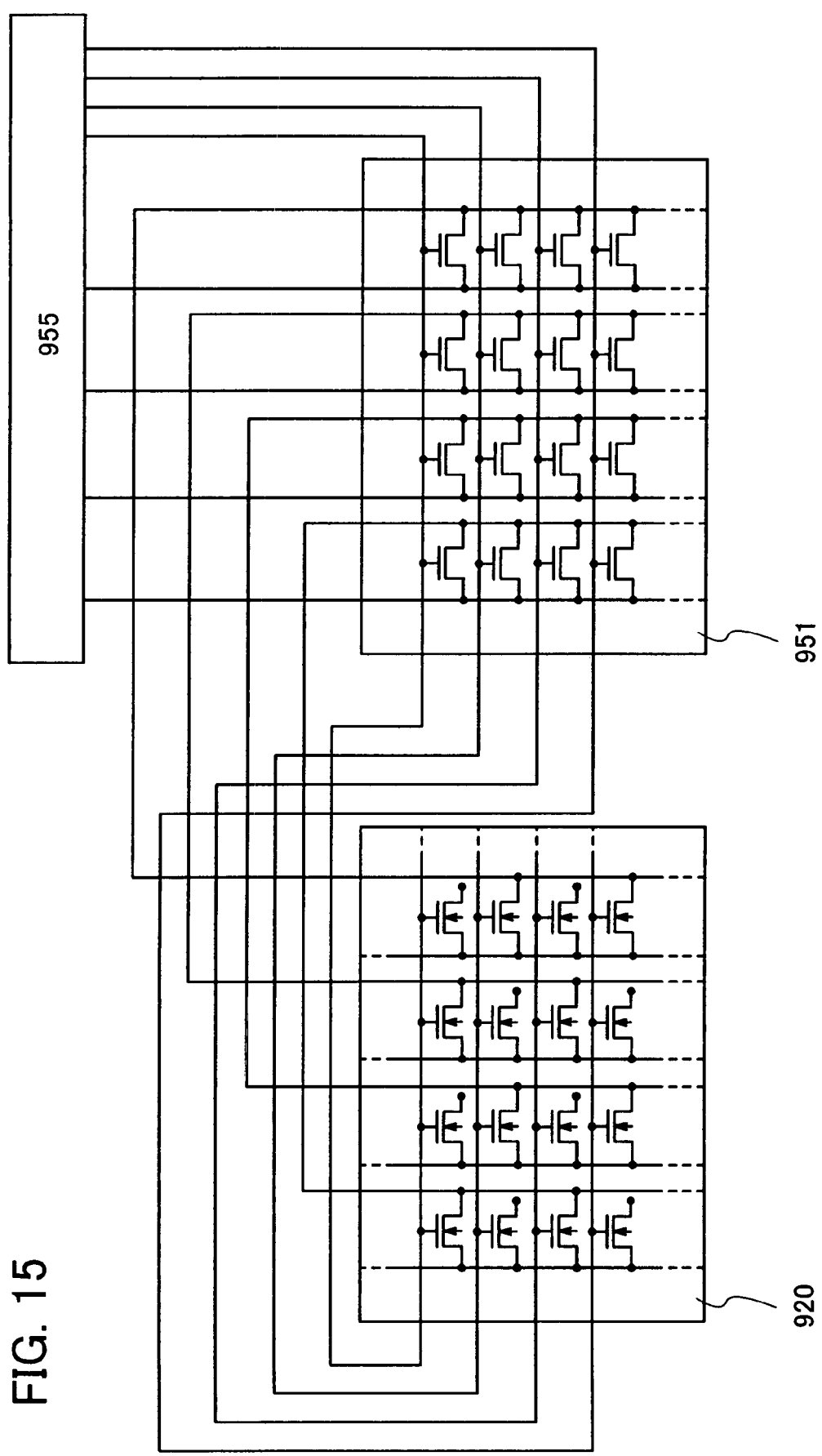
FIG. 15 is a block diagram showing a manufacturing process of a semiconductor device according to the present invention.

In the step of forming the separation region 169 by dissolving the electrode 110 shown in FIG. 9B, a circuit 951 and a computer 955 shown in FIG. 15 are connected to the memory cell array 920. The circuit 951 may be formed over the same substrate as that of the memory cell array 920 or may be externally attached.

TFTs corresponding to TFTs of the memory cell array 920 are formed in the circuit 951. The circuit 951 can selectively apply a desired voltage to an individual wiring (electrode) in the memory cell array 920 in accordance with a signal from the computer 955. With this voltage applied, the substrate is soaked in an electrolyte. The voltage in a condition of dissolving the wiring, which is set in consideration of the electrolyte and a wiring material, is applied to the wiring, thereby dissolving the wiring of an opening portion in the electrolyte. Thus, individual wirings (electrodes) over a surface of the substrate are selectively separated.

In order to secure space over a surface of the substrate, a part of the circuit 951 which is connected to the computer 955 and reaches the opening portion may be formed on a rear surface of the substrate. In this case, an opening portion reaching the rear surface from the surface is formed in the substrate, and a wiring is formed in the opening portion so as to penetrate through the substrate.

By the present invention, different individual data such as ID numbers can be easily given to individual semiconductor devices capable of wireless communication that use ICs. In particular, in manufacturing a large number of semiconductor devices capable of wireless communication over a large-area substrate, tact and cost can be reduced.

This embodiment mode can be implemented in combination with description in any of the other embodiment modes and embodiments as needed.

Embodiment Mode 2

In Embodiment Mode 2, a manufacturing process of TFTs of a memory cell array and TFTs of a logic circuit over the same substrate will be described with reference to FIGS. 16A to 16D, FIGS. 17A to 17C, FIGS. 18A to 18C, FIGS. 19A and 19B, and FIGS. 20A and 20B.

First, as shown in FIG. 16A, a base film 602 is formed over a substrate 601. As the substrate 601, a glass substrate of barium borosilicate glass, alumino borosilicate glass, or the like, a quartz substrate, a stainless-steel substrate, an SOI (Silicon on Insulator) substrate which is formed by formation of a single crystalline semiconductor layer on an insulating surface, or the like can be used. Also, a substrate including a synthetic resin having flexibility such as acrylic or plastic represented by poly(ethylene terephthalate) (PET), poly (ether sulfone) (PES), or poly(ethylene Naphthalate) (PEN) can be used. A case of using a glass substrate as the substrate 601 will be described below.

The base film 602 is provided to prevent an alkali metal such as Na or an alkaline earth metal contained in the substrate 601 from diffusing into a semiconductor film and causing an adverse effect on a characteristic of a semiconductor element. Therefore, the base film 602 is formed using an insulating film of silicon nitride, silicon oxide containing nitrogen, or the like which can suppress diffusion of the alkali metal or alkaline earth metal into the semiconductor film. In this embodiment mode, the base film 602 is formed by a plasma CVD method by stacking a silicon oxide film and a silicon oxide film containing nitrogen so that thicknesses thereof are 10 to 100 nm (preferably 20 to 70 nm, more preferably 50 nm) and 10 to 400 nm (preferably 50 to 300 nm, more preferably 100 nm), respectively.

Note that the base film 602 may be a single layer of an insulating film containing silicon nitride, silicon oxide containing nitrogen, silicon nitride containing oxygen, or a stack of layers of a plurality of insulating films of silicon oxide, silicon nitride, silicon oxide containing nitrogen, silicon nitride containing oxygen, or the like. Further, in a case of using a substrate containing an alkali metal or alkaline earth metal in any amount such as a glass substrate, a stainless-steel substrate, or a plastic substrate, it is effective to provide a base film in terms of preventing diffusion of an impurity; however, if diffusion of an impurity is not much of a problem as in a case of using a quartz substrate, it is not always necessary to provide a base film.

Next, a semiconductor film 604 is formed over the base film 602. The thickness of the semiconductor film 604 is set at 25 to 100 nm (preferably, 30 to 80 nm). Note that the semiconductor film 604 may be an amorphous semiconductor or a polycrystalline semiconductor. Also, silicon germanium (SiGe) can be used as well as silicon (Si) as a semiconductor. In a case of using silicon germanium, the concentration of germanium is preferably about 0.01 to 4.5 atomic %. In this embodiment mode, an amorphous silicon film is formed to have a thickness of 66 nm as the semiconductor film 604.

Next, a linear beam 603 is emitted to the semiconductor film 604 from a laser irradiation apparatus to carry out crystallization, as shown in FIG. 16B.

In the case of carrying out laser crystallization, the semiconductor film 604 may be subjected to heating treatment at 500° C. for one hour before laser crystallization, in order to increase resistance of the semiconductor film 604 against a laser beam.

For the laser crystallization, a continuous wave laser or a pulsed laser with a repetition rate of 10 MHz or more, preferably 80 MHz or more as a pseudo CW laser can be used.

Specifically, the following and the like can be given as examples of the continuous wave laser: an Ar laser, a Kr laser, a $CO_2$ laser, a YAG laser, a $YVO_4$ laser, a forsterite ($Mg_2SiO_4$) laser, a YLF laser, a $YAlO_3$ laser, a $GdVO_4$ laser, a $Y_2O_3$ laser, an alexandrite laser, a Ti:sapphire laser, a helium cadmium laser, and a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Also, as the pseudo CW laser, a pulsed laser such as the following can be used if pulse oscillation at a repetition rate of 10 MHz or more, preferably 80 MHz or more, is possible: an Ar laser, a Kr laser, an excimer laser, a $CO_2$ laser, a YAG laser, a $Y_2O_3$ laser, a $YVO_4$ laser, a forsterite ($Mg_2SiO_4$) laser, a YLF laser, $YAlO_3$ laser, a $GdVO_4$ laser, an alexandrite laser, a Ti:sapphire laser, a copper vapor laser, a gold vapor laser, or a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Such a pulsed laser eventually exhibits an effect equivalent to that of a continuous wave laser when the repetition rate is increased.

For example, in a case of using a solid-state laser capable of continuous oscillation, a crystal with a large grain diameter can be obtained by irradiation with laser light of a second harmonic to a fourth harmonic. Typically, it is desirable to use a second harmonic (532 nm) or a third harmonic (355 nm) of the YAG laser (fundamental wave of 1064 nm). For example, laser light emitted from a continuous wave YAG laser is converted to a high harmonic by a nonlinear optical element, and emitted to the semiconductor film 604. The power density may be about 0.01 to 100 $MW/cm^2$ (preferably 0.1 to 10 $MW/cm^2$). Then, irradiation is carried out with a scanning speed of about 10 to 2000 cm/sec.

Note that a laser of which a medium is a single-crystalline YAG, $YVO_4$, forsterite ($Mg_2SiO_4$), $YAlO_3$, or $GdVO_4$ doped with one or more of Nd, Yb, Cr, Ti, Ho, Er, Tm, and Ta as a dopant, or a polycrystalline (ceramic) YAG, $Y_2O_3$, $YVO_4$, $YAlO_3$, or $GdVO_4$, doped with one or more of Nd, Yb, Cr, Ti, Ho, Er, Tm, and Ta as a dopant; an Ar laser; a Kr laser; or a Ti:sapphire laser is capable of continuous oscillation, and also capable of pulse oscillation by carrying out a Q switch operation, mode locking, or the like. When a laser beam is oscillated at a repetition rate of 10 MHz or more, the semiconductor film is irradiated with a subsequent pulse while the semiconductor film is melted by a preceding laser and then solidified. Consequently, since a solid-liquid interface in the semiconductor film can be moved continuously unlike in a case of using a pulsed laser with a low repetition rate, crystal grains that continuously grow toward a scanning direction can be obtained.

When ceramics (polycrystals) are used for a medium, the medium can be formed into a free shape in a short amount of time and at low cost. When single crystals are used, a column-shaped medium with several mm in diameter and several tens of mm long is usually used, but a larger medium can be formed when ceramic is used.

Since the concentration of a dopant such as Nd or Yb in the medium which directly contributes to light emission cannot be changed significantly in either single crystals or polycrystals, improvement in laser output by increasing the concentration is limited to a certain extent. However, in the case of ceramics, there is a possibility that output can be drastically improved since the size of the medium can be significantly increased compared to single crystals.

Further, in the case of ceramics, a medium having a parallelepiped shape or a rectangular parallelepiped shape can be easily formed. When a medium having such a shape is used and oscillation light travels in a zigzag in the medium, an oscillation light path can be longer. Accordingly, amplification is increased and oscillation with high output becomes possible. Since a laser beam emitted from the medium having such a shape has a cross section of a quadrangular shape when being emitted, a linear beam can be easily shaped compared with the case of a circular beam. The laser beam emitted in such a manner is shaped by using an optical system; accordingly, a linear beam having a short side of less than or equal to 1 mm and a long side of several mm to several m can be easily obtained. In addition, by uniformly irradiating the medium with excited light, a linear beam has a uniform energy distribution in a long side direction.

By irradiation of the semiconductor film with this linear beam, the entire surface of the semiconductor film can be annealed more uniformly. In the case where uniform annealing is required from one end to the other end of the linear beam, slits may be provided for the ends so as to shield a portion where energy is attenuated from light.

By irradiating the semiconductor film 604 with laser light as mentioned above, a crystalline semiconductor film 605 with improved crystallinity is formed.

Next, as shown in FIG. 16C, the crystalline semiconductor film 605 is used to form island-shaped semiconductor films 611 to 614. These island-shaped semiconductor films 611 to 614 serve as active layers of TFTs to be formed in a subsequent process.

In this embodiment mode, the case of using a glass substrate as the substrate 601 is described; however, in the case of using an SOI substrate as the substrate 601, a single-crystalline semiconductor layer may be formed into an island shape to serve as an active layer of a TFT.

Next, an impurity is introduced into the island-shaped semiconductor films 611 to 614 for controlling threshold voltages. In this embodiment mode, boron (B) is introduced into the island-shaped semiconductor films 611 to 614 by doping of diborane ($B_2H_6$).

Next, a gate insulating film 615 is formed over the island-shaped semiconductor films 611 to 614. For the gate insulating film 615, silicon oxide, silicon nitride, silicon oxide containing nitrogen, or the like with a film thickness of 10 to 110 nm can be used, for example. Also, as a film formation method, a plasma CVD method, a sputtering method, or the like can be used. In this embodiment mode, the gate insulating film 615 is formed using a silicon oxide film containing nitrogen that is formed by a plasma CVD method to have a film thickness of 20 nm.

Then, after forming a conductive film over the gate insulating film 615, gate electrodes 621 to 624 are formed using the conductive film.

The gate electrodes 621 to 624 are formed to have a structure with a single layer of a conductive film, or a structure in which two or more layers of conductive films are stacked. In the case where two or more conductive films are stacked, the gate electrodes 621 to 624 may be formed by stacking layers of an element selected from tantalum (Ta), tungsten (W), titanium (Ti), molybdenum (Mo), or aluminum (Al); or an alloy material or compound material mainly containing the element. Alternatively, the gate electrodes may be formed using a semiconductor film typified by a polycrystalline silicon film doped with an impurity element such as phosphorus (P). In this embodiment mode, the gate electrodes 621 to 624 are formed using a tantalum nitride (TaN) film with a thickness of 10 to 50 nm, for example, 30 nm, which is formed as lower-layer gate electrodes 621a to 624a, and a tungsten (W) film with a thickness of 200 to 400 nm, for example, 370 nm, which is formed as upper-layer gate electrodes 621b to 624b.

The gate electrodes 621 to 624 may be formed as a portion of a gate wiring. Alternatively, a gate wiring may be separately formed, and then the gate electrodes 621 to 624 may be connected to the gate wiring.

Next, an impurity imparting one conductivity type is added to the island-shaped semiconductor films 611 to 613. In this adding step, the island-shaped semiconductor film 614 and the gate electrode 624, i.e. a region to be a p-channel TFT 694, is covered with a resist 618, and the impurity imparting one conductivity type is not added to the island-shaped semiconductor film 614.

As the impurity imparting one conductivity type, phosphorus (P) or arsenic (As) may be used when using an impurity imparting n-type conductivity. When using an impurity imparting p-type conductivity, boron (B) may be used.

In this embodiment mode, first, as a first adding step, an impurity imparting n-type conductivity is added to the island-shaped semiconductor films 611 to 613 (FIG. 16D). Specifically, phosphorus (P) is introduced into the island-shaped semiconductor films 611 to 613 using phosphine ($PH_3$), with an application voltage of 40 to 120 keV, and a dose amount of $1\times10^{13}$ to $1\times10^{15}$ cm$^{-2}$. In this embodiment mode, phosphorus is added into the island-shaped semiconductor films 611 to 613 using phosphine, with an application voltage of 60 keV and a dose amount of $2.6\times10^{-13}$ cm$^{-2}$. At the time of this introduction of the impurity, regions to be channel forming regions 631, 641, and 651 are determined.

Then, insulating films, i.e. sidewalls 626 to 629, are formed so as to cover side surfaces of the gate electrodes 621 to 624, as shown in FIG. 17A. In other words, the sidewalls 626 (626a and 626b) are formed on the side surfaces of the gate electrode 621, the sidewalls 627 (627a and 627b) are formed on the side surfaces of the gate electrode 622, the sidewalls 628 (628a and 628b) are formed on the side surfaces of the gate electrode 623, and the sidewalls 629 (629a and 629b) are formed on the side surfaces of the gate electrode 624.

The sidewalls 626 to 629 can be formed from an insulating film including silicon by a plasma CVD method or a low pressure CVD (LPCVD) method. In this embodiment mode, taper-shaped sidewalls 626 to 629 are formed by formation of a silicon oxide film with a film thickness of 50 to 200 nm, preferably 100 nm by a plasma CVD method, and etching of the silicon oxide film. Alternatively, the sidewalls 626 to 629 may be formed using a silicon oxide film containing nitrogen.

Also, end portions of the sidewalls 626 to 629 need not necessarily have a taper shape, and they may have a rectangular shape.

Next, as shown in FIG. 17B, a resist 616 is formed to cover the island-shaped semiconductor film 614, the gate electrode 624, and the sidewalls 629, which are a region later to be the p-channel TFT 694.

Further, as a second adding step, phosphorus (P) is introduced into the island-shaped semiconductor films 611 to 613 using phosphine ($PH_3$), with an application voltage of 10 to 50 keV, for example 20 keV, and a dose amount of $5.0\times10^{14}$ to $2.5\times10^{16}$ cm$^{-2}$, for example $3.0\times10^{15}$ cm$^{-2}$.

As the second adding step, using the gate electrode 621 and the sidewalls 626 as masks, phosphorus is introduced into the island-shaped semiconductor film 611; accordingly, a region 633, which is one of a source region and a drain region, a region 634 which is the other of the source region and the drain region, and low-concentration impurity regions 632a and 632b are formed in the island-shaped semiconductor film 611. Similarly, using the gate electrode 622 and the sidewalls 627 as masks, phosphorus is introduced into the island-shaped semiconductor film 612, and a region 643, which is one of a source region and a drain region, a region 644, which is the other of the source region and the drain region, and low-concentration impurity regions 642a and 642b are formed in the island-shaped semiconductor film 612. Further, using the gate electrode 623 and the sidewalls 628 as masks, phosphorus is introduced into the island-shaped semiconductor film 613, and a region 653, which is one of a source region and a drain region, a region 654, which is the other of the source region and the drain region, and low-concentration impurity regions 652a and 652b are formed in the island-shaped semiconductor film 613.

In this embodiment mode, phosphorus (P) is included in the regions 633 and 634, which are the source region and the drain region of an n-channel TFT 691, the regions 643 and 644, which are the source region and the drain region of an n-channel TFT 692, and the regions 653 and 654, which are the source region and the drain region of an n-channel TFT 693, at a concentration of $1 \times 10^{19}$ to $5 \times 10^{21}$ cm$^{-3}$.

Also, phosphorus (P) is included at a concentration of $1 \times 10^{18}$ to $5 \times 10^{19}$ cm$^{-3}$ in the low-concentration impurity regions 632a and 632b of the n-channel TFT 691, the low-concentration impurity regions 642a and 642b of the n-channel TFT 692, and the low-concentration impurity regions 652a and 652b of the n-channel TFT 693.

Then, the resist 616 is removed, and a resist 617 is formed covering the island-shaped semiconductor films 611 to 613, the gate electrodes 621 to 623, and the sidewalls 626 to 628, that is a region to be the n-channel TFTs 691 to 693.

In order to form the p-channel TFT 694, an impurity imparting the opposite conductivity type to the above-described impurity imparting one conductivity type, that is an impurity imparting p-type conductivity is added to the island-shaped semiconductor film 614. Specifically, using diborane (B$_2$H$_6$), boron (B) is introduced into the island-shaped semiconductor film 614 under a condition in which an application voltage is 60 to 100 keV, for example, 80 keV, and a dose amount is $1 \times 10^{13}$ to $5 \times 10^{15}$ cm$^{-2}$, for example, $3 \times 10^{15}$ cm$^{-2}$. Consequently, regions 663 and 664 which are a source region and a drain region of the p-channel TFT are formed, and in addition, a channel forming region 661 is formed with this introduction of the impurity (FIG. 17C).

Note that with regard to introduction of boron into the p-channel TFT 694, since application voltage is high, a sufficient amount of boron for forming the region 663 and the region 664 is added to the island-shaped semiconductor film 614 even through the sidewalls 629 and the gate insulating film 615.

In the regions 663 and 664 which are the source region and the drain region of the p-channel TFT 694, boron (B) is included at a concentration of $1 \times 10^{19}$ to $5 \times 10^{21}$ cm$^{-3}$.

Next, the resist 617 is removed, and a first interlayer insulating film 671 is formed so as to cover the island-shaped semiconductor films 611 to 614, the gate insulating film 615, the gate electrodes 621 to 624, and the sidewalls 626 to 629.

As the first interlayer insulating film 671, an insulating film containing silicon, for example, a silicon oxide film, a silicon nitride film, or a silicon oxide film containing nitrogen, or a stacked film thereof is formed by a plasma CVD method or a sputtering method. Of course, the first interlayer insulating film 671 is not limited to the silicon oxide film containing nitrogen, the silicon nitride film, or the stacked film thereof, and other insulating film containing silicon may be used in a single-layer or stacked-layer structure.

In this embodiment mode, a silicon oxide film containing nitrogen is formed to have a thickness of 50 nm by a plasma CVD method, and an impurity is activated by a laser irradiation method. Alternatively, after forming the silicon oxide film containing nitrogen, the impurity may be activated by heating in a nitrogen atmosphere at 550° C. for four hours.

Next, a silicon nitride film is formed to have a thickness of 100 nm by a plasma CVD method, and a silicon oxide film is additionally formed to have a thickness of 600 nm. These stacked layers of the silicon oxide film containing nitrogen, the silicon nitride film, and the silicon oxide film are the first interlayer insulating film 671.

Then, the entire substrate is heated at 410° C. for one hour, and hydrogenation is carried out by releasing hydrogen from the silicon nitride film.

Next, a second interlayer insulating film 672 is formed so as to cover the first interlayer insulating film 671 (FIG. 18A).

For the second interlayer insulating film 672, an inorganic material such as an oxide of silicon or nitride of silicon can be used by using a CVD method, a sputtering method, an SOG (Spin On Glass) method, or the like. In this embodiment mode, a silicon oxide film is formed as the second interlayer insulating film 672.

An insulating film using siloxane may be formed as the second interlayer insulating film 672. The siloxane has a skeletal structure including a bond of silicon (Si) and oxygen (O), and an organic group containing at least hydrogen (for example, an alkyl group or aromatic hydrocarbon) is used for a substituent. Alternatively, a fluoro group may be used for the substituent. Further, the organic group containing at least hydrogen and the fluoro group may be used for the substituent.

A third interlayer insulating film may be formed over the second interlayer insulating film 672. As the third interlayer insulating film, a film that does not easily allow penetration of moisture, oxygen, and the like compared to other insulating films may be formed. Typically, a silicon nitride film, a silicon oxide film, a silicon nitride film containing oxygen, a silicon oxide film containing nitrogen, a thin film mainly containing carbon (for example, a diamong-like carbon (DLC) film or a carbon nitride (CN) film), or the like which is obtained by a sputtering method or a CVD method, can be used.

Next, contact holes for electrical connection to the island-shaped semiconductor films 611, 612, 613, and 614 are formed in the interlayer insulating films 671 and 672.

In the interlayer insulating films 671 and 672, a contact hole 673 reaching the region 633 of the island-shaped semiconductor film 611, a contact hole 674 reaching the region 634 of the island-shaped semiconductor film 611, a contact hole 675 reaching the region 643 of the island-shaped semiconductor film 612, a contact hole 676 reaching the region 644 of the island-shaped semiconductor film 612, a contact hole 677 reaching the region 653 of the island-shaped semiconductor film 613, a contact hole 678 reaching the region 654 of the island-shaped semiconductor film 613, a contact hole 679 reaching the region 663 of the island-shaped semiconductor film 614, and a contact hole 680 reaching the region 664 of the island-shaped semiconductor film 614 are formed (FIG. 18B).

Note that the contact holes 673 to 680 may each include either one contact hole or a plurality of contact holes.

Then, over the second interlayer insulating film 672, a conductive film is formed, and using the conductive film, source electrodes and drain electrodes 681, 682, 683, 684, 685, 686, and 687 are formed (FIG. 18C).

The electrode 681, which is one of the source electrode and the drain electrode of the TFT 691, is electrically connected to the region 633, and the electrode 682, which is the other of the source electrode and the drain electrode, is electrically connected to the region 634. The electrode 683, which is one of the source electrode and the drain electrode of the TFT 692, is electrically connected to the region 643. The electrode 684, which is the other of the source electrode and the drain electrode, is electrically connected to the region 644.

The electrode 685, which is one of the source electrode and the drain electrode of the TFT 693, is electrically connected to the region 653. The electrode 686, which is the other of the source electrode and the drain electrode of the TFT 693 and which is one of the source electrode and the drain electrode of the TFT 694, is electrically connected to the region 654 and the region 663. The electrode 687, which is the other of the source electrode and the drain electrode of the TFT 694, is electrically connected to the region 664. Thus, TFTs 693 and 694 form a CMOS circuit 695.

In this embodiment mode, the electrodes 681 to 687 are formed by a CVD method, a sputtering method, or the like using an element such as aluminum (Al), tungsten (W), titanium (Ti), tantalum (Ta), molybdenum (Mo), nickel (Ni), cobalt (Co), iron (Fe), platinum (Pt), copper (Cu), gold (Au), silver (Ag), manganese (Mn), neodymium (Nd), carbon (C), or silicon (Si), or an alloy material or a compound material containing the above element as its main component, with a single layer structure or a stacked structure. An alloy material containing aluminum as its main component corresponds to, for example, a material containing nickel, whose main component is aluminum, or an alloy material containing nickel and one or both of carbon and silicon, whose main component is aluminum. For the electrodes 681 to 687, for example, a stacked structure of a barrier film, an aluminum-silicon (Al—Si) film, and a barrier film, or a stacked structure of a barrier film, an aluminum-silicon (Al—Si) film, a titanium nitride (TiN) film, and a barrier film may be preferably employed. It is to be noted that the barrier film corresponds to a thin film formed using titanium, a nitride of titanium, molybdenum, or a nitride of molybdenum. Aluminum and aluminum silicon which have a low resistance and are inexpensive are optimal materials for forming the electrodes 681 to 687. In addition, an aluminum alloy film can prevent interdiffusion between silicon and aluminum even when being in contact with silicon. In addition, generation of a hillock of aluminum or aluminum silicon can be prevented when upper and lower barrier layers are provided.

In this embodiment mode, the electrodes 681 to 687 are formed using stack layers of a titanium (Ti) film, a titanium nitride film, an aluminum (Al) film, and a titanium (Ti) film, which are 60 nm, 50 nm, 500 nm, and 100 nm, respectively.

The electrodes 681 to 687 may be formed by using the same material and the same process as those of a wiring, or the electrodes and the wiring may be separately formed and then may be connected.

Figure 19A:
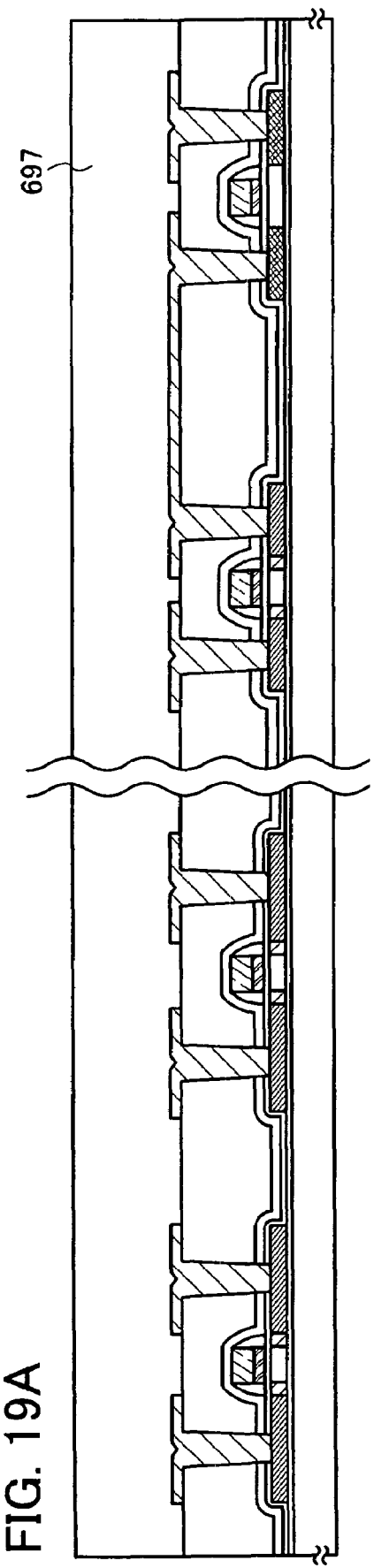
FIGS. 19A and 19B are cross sectional views of a manufacturing process of a semiconductor device according to the present invention.

Next, an interlayer insulating film 697 is formed over the electrodes 681 to 687 and the interlayer insulating film 672 or over a passivation film in the case where the passivation film is formed (FIG. 19A). The interlayer insulating film 697 may be formed of a similar material to that of the interlayer insulating film 672.

Figure 19B:
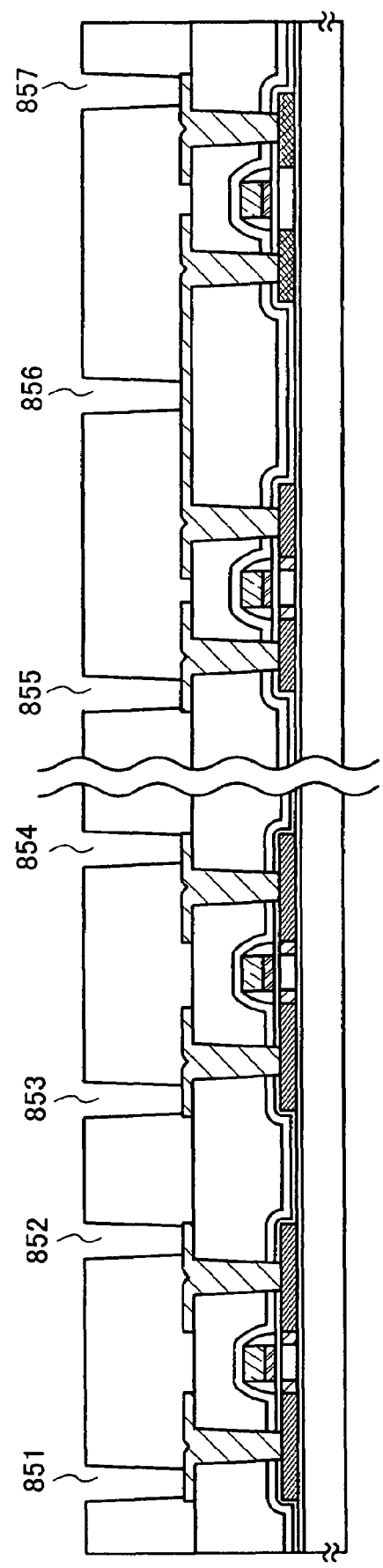

In the interlayer insulating film 672, a contact hole 851 reaching the electrode 681, a contact hole 852 reaching the electrode 682, a contact hole 853 reaching the electrode 683, a contact hole 854 reaching the electrode 684, a contact hole 855 reaching the electrode 685, a contact hole 856 reaching the electrode 686, and a contact hole 857 reaching the electrode 687 are formed (FIG. 19B).

Then, the whole substrate is soaked in an electrolyte. The electrolyte may be an electrolyte capable of dissolving the material of the electrodes 681 to 687. The combination of the material for forming the electrodes 681 to 687 and the electrolyte may be selected from those shown in Table 1 described in Embodiment Mode 1. Note that the object soaked in the electrolyte does not need to be the whole substrate as long as the electrode can be dissolved.

Figure 20A:
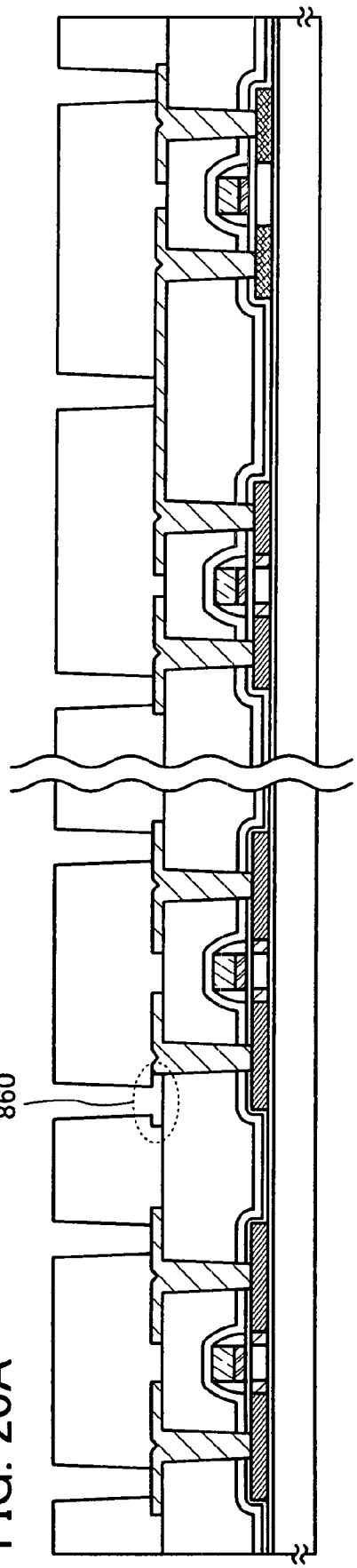
FIGS. 20A and 20B are cross sectional views of a manufacturing process of a semiconductor device according to the present invention.

When the electrode is soaked in the electrolyte and is applied with a voltage, metal on a surface of the electrode dissociates as ions into the electrolyte, so that the electrode material is dissolved. As shown in FIG. 20A, a part of the electrode 683 is dissolved so that a separation region 860 is formed.

Figure 20B:
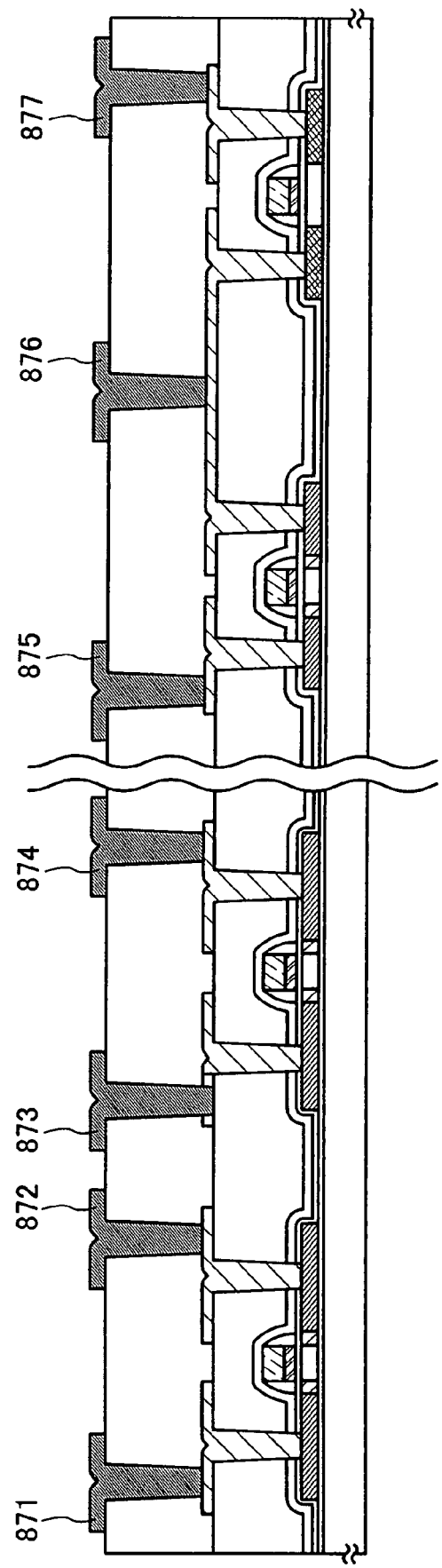

Next, as shown in FIG. 20B, a wiring 871 electrically connected to the electrode 681, a wiring 872 electrically connected to the electrode 682, a wiring 874 electrically connected to the electrode 684, a wiring 875 electrically connected to the electrode 685, a wiring 876 electrically connected to the electrode 686, and a wiring 877 electrically connected to the electrode 687 are formed over the interlayer insulating film 697.

A wiring 873 is formed over the interlayer insulating film 672 and over the electrode 683. Since the wiring 873 is formed so as to reach the separation region 860, the wiring 873 is not electrically connected to the electrode 683.

The wirings 871 to 877 may be formed of any of the above-described materials for forming the electrode 681 and the like.

In the above-described manner, TFTs of a memory cell array and TFTs of a logic circuit are formed over the same substrate.

This embodiment mode can be implemented in combination with any of other embodiment modes and embodiments as needed.

Embodiment Mode 3

Embodiment Mode 3 will describe a manufacturing method of a semiconductor device capable of wireless communication that uses an IC, which is different from those in Embodiment Modes 1 and 2 with reference to FIG. 14, FIGS. 21A and 21B, FIGS. 22A and 22B, and FIG. 23. In this embodiment mode, components which are the same as those in Embodiment Mode 1 or Embodiment Mode 2 are denoted by the same reference numerals.

First, in accordance with the description in Embodiment Mode 2, a semiconductor device shown in FIG. 20B is manufactured. Note that instead of the base film 602, a separation layer 802, a first base film 803, and a second base film 804 are formed.

The separation layer 802 is formed of an amorphous semiconductor film, a polycrystalline semiconductor film, or a semi-amorphous semiconductor film. For example, a layer mainly containing silicon such as amorphous silicon, polycrystalline silicon, single-crystalline silicon, or semi-amorphous silicon. The separation layer 802 can be formed by a sputtering method, a plasma CVD method, or the like. In this embodiment mode, the separation layer 802 is formed of amorphous silicon in approximately 500 nm thick by a sputtering method.

Note that a semi-amorphous semiconductor film (hereinafter also referred to as a SAS film) includes a semiconductor which has a structure intermediate between an amorphous semiconductor film and a semiconductor film having a crystalline structure (including single-crystalline and polycrystalline structures). The semi-amorphous semiconductor film has a third state which is stable in terms of free energy and is a crystalline substance having short-range order and lattice distortion. The crystal grain of which the size is 0.5 to 20 nm can exist by being dispersed in a non-single crystalline semiconductor film. The peak of the Raman spectrum of a semi-amorphous semiconductor film is shifted to be lower than the frequency of 520 cm$^{-1}$, and the diffraction peaks of (111) and (220) that are thought to be caused by an Si crystal lattice are observed by X-ray diffraction. In addition, the semi-amorphous semiconductor film contains hydrogen or halogen of at least 1 atomic % or more to terminate a dangling bond. In this specification, such a semiconductor film is referred to as a semi-amorphous semiconductor (SAS) film for the sake of convenience. Moreover, a rare gas element such as helium, argon, krypton, or neon may be contained therein to further promote lattice distortion so that stability is enhanced and a favorable semi-amorphous semiconductor film can be obtained. Note that a microcrystalline semiconductor film (microcrystal semiconductor film) is also included in the semi-amorphous semiconductor film.

In addition, the SAS film can be obtained by glow discharge decomposition of a gas containing silicon. For a typical gas containing silicon, $SiH_4$ is given, and, in addition, $Si_2H_6$, $SiH_2Cl_2$, $SiHCl_3$, $SiCl_4$, $SiF_4$, or the like can be used. The gas containing silicon may be diluted with hydrogen or with a gas in which one or more of rare gas elements of helium, argon, krypton, and neon are added to hydrogen; therefore, the SAS film can be easily formed. It is preferable that the gas containing silicon be diluted at a dilution rate set to be in the range of 2 to 1000 times. Further, a carbide gas such as $CH_4$ or $C_2H_6$, a germanium gas such as $GeH_4$ or $GeF_4$, $F_2$, or the like may be mixed into the gas containing silicon so as to adjust the energy bandwidth to be from 1.5 to 2.4 eV or 0.9 to 1.1 eV.

Each of the base films 803 and 804 includes an insulating film such as a silicon oxide film, a silicon nitride film, a silicon nitride film containing oxygen, or a silicon oxide film containing nitrogen. In this embodiment mode, a silicon nitride film containing oxygen with a thickness of 10 to 200 nm as the first base film 803 and a silicon oxide film containing nitrogen with a thickness of 50 to 200 nm as the second base film 804 are sequentially stacked and formed.

In accordance with the description in Embodiment Mode 2, the process up to formation of wirings 871 to 877 is performed. Then, an interlayer insulating film 806 is formed over an interlayer insulating film 697, and electrodes 811 to 816 functioning as antennas are formed. The electrodes 811 to 816 functioning as the antennas are formed of a conductive material by a CVD method, a sputtering method, a printing method such as screen printing or gravure printing, a droplet discharge method, a dispenser method, a plating method, or the like. The conductive material may be an element of aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing the element as its main component, and formed using a single layer structure or a stacked structure.

A protective layer 807 is formed over the third interlayer insulating film 806 so as to cover the electrodes 811 to 816 functioning as the antennas. For the protective layer 807, a material is used which can protect the electrodes 811 to 816 functioning as the antennas when the separation layer 802 is later removed by etching. For example, the protective layer 807 can be formed by application of an epoxy based resin, an acrylate based resin, or a silicon based resin, which is soluble in water or in alcohols, over an entire surface (FIG. 21A).

Next, a groove 808 for separating the separation layer 802 is formed (FIG. 21B). The groove 808 may be formed at least to expose the separation layer 802. The groove 808 can be formed by etching, dicing, scribing, laser irradiation, or the like.

Then, the separation layer 802 is removed by etching (FIG. 22A). In this embodiment mode, halogen fluoride is used as an etching gas which is inlet through the groove 808. In this embodiment mode, for example, etching is performed by using $ClF_3$ (chlorine trifluoride) at 350° C. at a flow rate of 300 sccm with a pressure of 800 Pa for 3 hours. Further, a $ClF_3$ gas mixed with nitrogen may be used as well. By using halogen fluoride such as $ClF_3$, the separation layer 802 is selectively etched so that a substrate 601 can be separated. It is to be noted that halogen fluoride may be either a gas or liquid.

Next, a memory cell array including TFTs 691 and 692 and a logic circuit including TFTs 693 and 694, which are separated, are attached to a support base 821 with an adhesive 822 (FIG. 22B). As the adhesive 822, a material capable of attaching the support base 821 to the first base film 803 is used. For example, various curable adhesives such as a reaction curable adhesive, a heat curable adhesive, a light curable adhesive such as an ultraviolet curable adhesive, and an anaerobiotic adhesive can be used as the adhesive 822.

As the support base 821, an organic material such as a flexible paper or plastic can be used. Alternatively, a flexible inorganic material may be used as the support base 821. It is preferable that the support base 821 have a heat conductivity as high as 2 to 30 W/mK for dispersing heat generated at the integrated circuit.

The integrated circuit including the memory cell array and the logic circuit can be separated from the substrate 601 by various methods as well as by etching of a layer mainly containing silicon as described in this embodiment mode. For example, a metal oxide film is provided between a substrate having high heat resistance and the integrated circuit and the metal oxide film is made vulnerable by crystallization, thereby the integrated circuit can be separated. Further, for example, the separation layer is broken by laser light irradiation so that the integrated circuit can be separated from the substrate. Moreover, for example, the substrate over which the integrated circuit is formed can be mechanically removed or removed by etching with a solution or a gas, so that the integrated circuit can be separated from the substrate.

In the case where an object has a curved surface and thus a support base of a semiconductor device which is attached to the curved surface and includes a memory cell array and a logic circuit is bent so as to have a curved surface along a generating line of a conical surface, a columnar surface, or the like, it is preferable that the direction of the generating line and a direction that carriers of a TFT move be the same. By the aforementioned structure, it can be prevented that characteristics of a TFT are affected when the support base is bent. Further, when the island-shaped semiconductor film occupies 1 to 30% of an area of the integrated circuit, even though the support base is bent, an affect to the characteristics of a TFT can be prevented.

Through the above-described manufacturing process, a semiconductor device capable of wireless communication that uses an IC according to the present invention is manufactured.

In this embodiment mode, the antennas are formed over the substrate over which the semiconductor device is formed. However, after formation of a semiconductor device, an antenna may be formed by a printing method over a substrate over which the semiconductor device is formed. Alternatively, an antenna may be separately formed over a substrate which is different from a substrate over which a semiconductor device is formed, and the substrate over which the semiconductor device is formed and the substrate over which the antenna is formed may be attached to each other, so that the semiconductor device may be electrically connected to the antenna.

Figure 23:
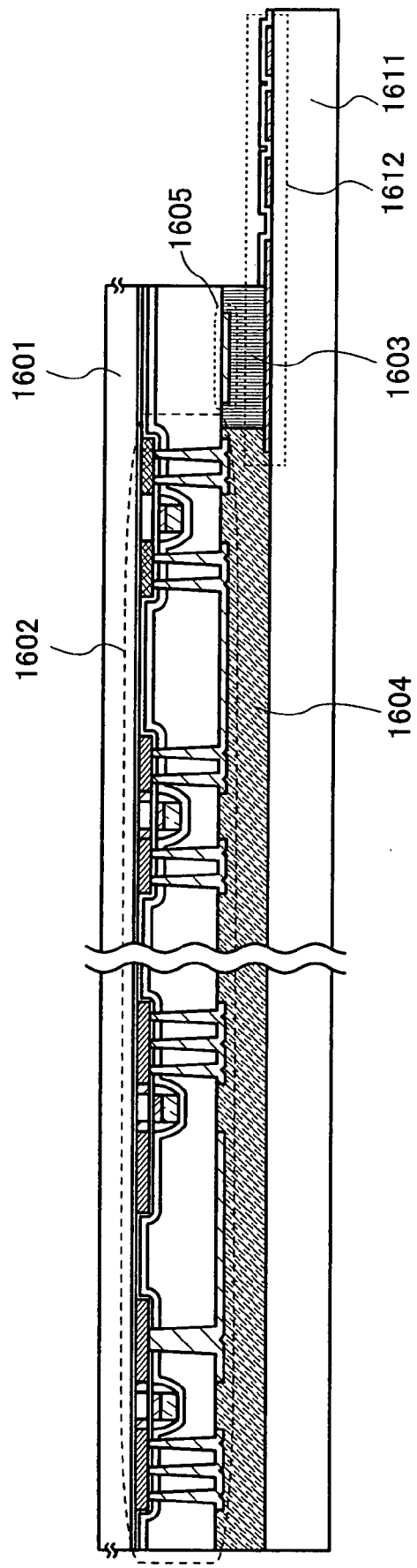
FIG. 23 is a cross sectional view of a manufacturing process of a semiconductor device according to the present invention.

An example of separately forming an antenna over a substrate which is different from a substrate over which a semiconductor device is formed, attaching the substrate over which the semiconductor device is formed to the substrate over which the antenna is formed, and electrically connecting the semiconductor device to the antenna will be described with reference to FIG. 23 and FIG. 14.

Over a substrate 1601 over which a semiconductor device 1602 including a memory cell array and a logic circuit is provided, a terminal portion 1605 including a terminal electrode and the like is provided.

Then, the terminal portion 1605 is electrically connected to an antenna 1612 which is provided over a substrate 1611 which is different from the substrate 1601. The substrate 1601 and the substrate 1611 over which the antenna 1612 is formed are attached so as to connect to the terminal portion 1605. A conductive particle 1603 and a resin 1604 are provided between the substrate 1601 and the substrate 1611. With the conductive particle 1603, the antenna 1612 and the terminal portion 1605 are electrically connected. Note that the antenna 1612 shown in FIG. 23 is equivalent to an antenna 917 shown in FIG. 14, and the antenna 1612 and the antenna 917 are electrically connected to a ground potential (GND) and circuits such as a power supply circuit 915 and a high-frequency circuit 914.

This embodiment mode can be implemented in combination with any of other embodiment modes and embodiments.

Embodiment 1

Figure 2:
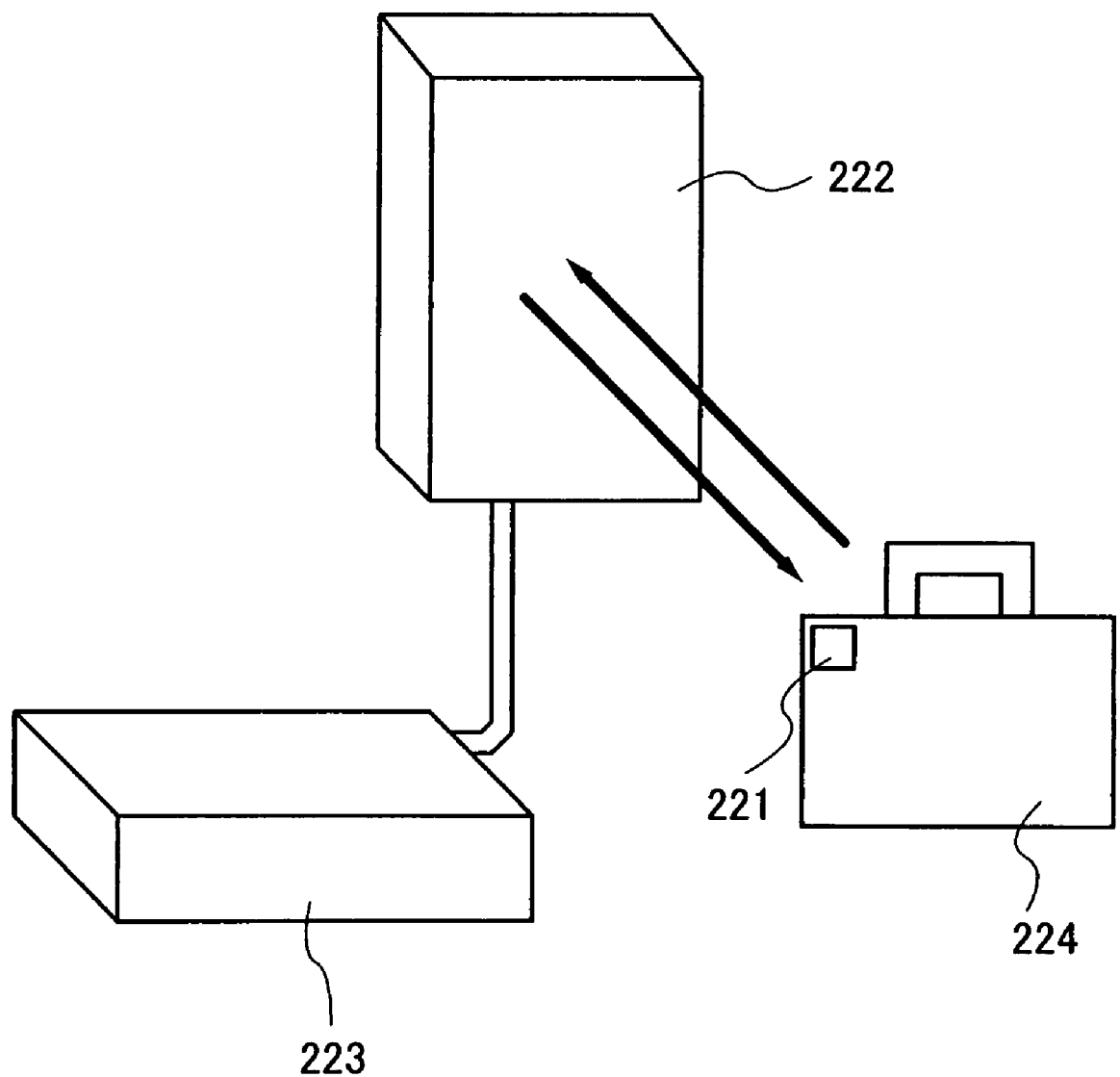
FIG. 2 is a schematic view of an individual recognition system.
Figure 3:
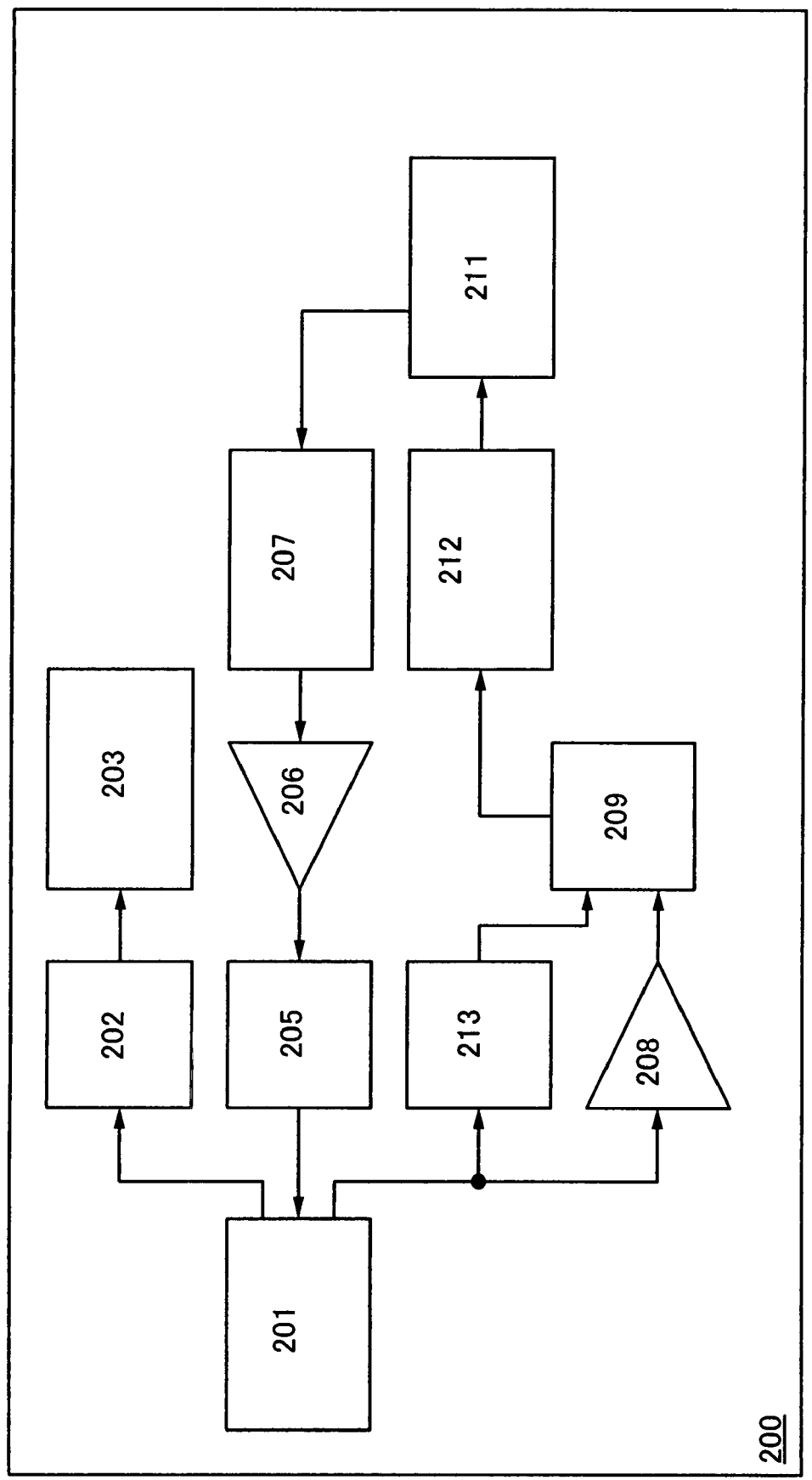
FIG. 3 is a block diagram showing a structure of a conventional semiconductor device.
Figure 4A:
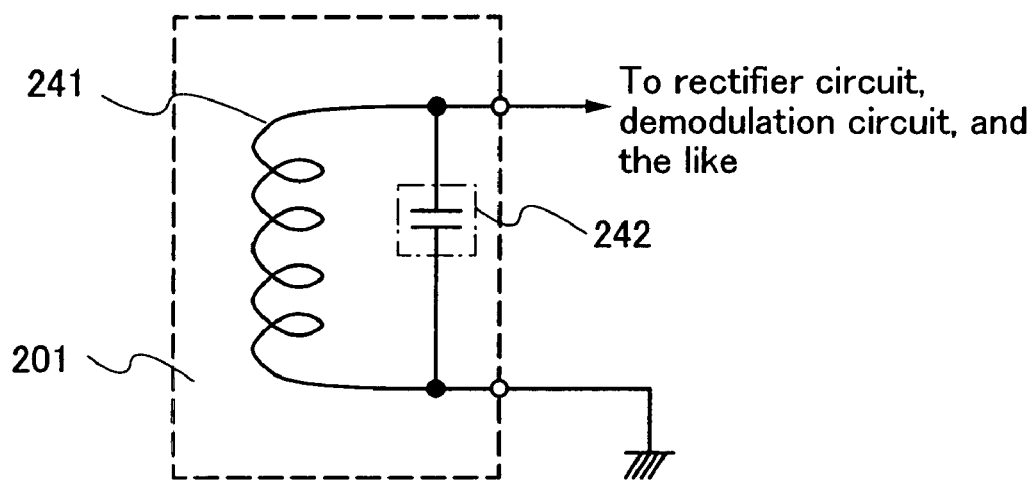
FIGS. 4A and 4B are block diagrams showing structures of a conventional semiconductor device.
Figure 4B:
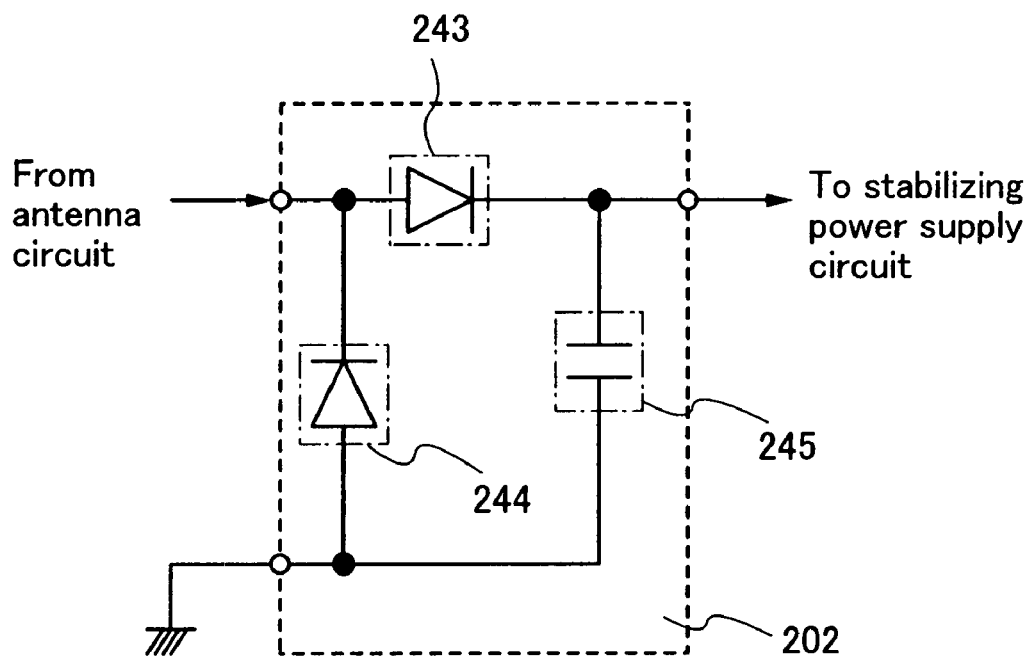

Embodiment 1 will describe a structure and operation of a semiconductor device capable of wireless communication that uses an IC, which is formed using the present invention, with reference to FIG. 2, FIG. 10, and FIG. 14.

First, the structure is described. As shown in FIG. 14, a semiconductor device (also referred to as an ID chip, an IC chip, an IC tag, an ID tag, a wireless chip, or an RFID) 931 formed using the present invention includes circuit blocks of an antenna 917, a high-frequency circuit 914, a power supply circuit 915, a reset circuit 911, a rectifier circuit 906, a demodulation circuit 907, an analog amplifier 908, a clock generation circuit 903, a modulation circuit 909, a signal output control circuit 901, a CRC circuit 902, and a mask ROM 900. The power supply circuit 915 includes circuit blocks of a rectifier circuit and a storage capacitor. Further, as shown in FIG. 13, the mask ROM 900 includes a memory cell array 920, a column decoder 921, and a row decoder 922.

As the antenna 917, any of a dipole antenna, a patch antenna, a loop antenna, and a Yagi antenna can be used.

In addition, as a method for transmitting and receiving a wireless signal in the antenna 917, any of an electromagnetic coupling method, an electromagnetic induction method, and an electromagnetic wave method may be used.

The semiconductor device 931 formed using the present invention is applied to a semiconductor device 221 shown in FIG. 2.

Next, the operation of the semiconductor device 931 formed using the present invention is described. A wireless signal is transmitted from an antenna unit 222 which is electrically connected to an interrogator (also referred to as a reader/writer) 223. The wireless signal includes an instruction from the interrogator (also referred to as a reader/writer) 223 to the semiconductor device 931.

The wireless signal received by the antenna 917 is transmitted to each circuit block via the high-frequency circuit 914. The signal transmitted to the power supply circuit 915 via the high-frequency circuit 914 is input to the rectifier circuit.

Here, the rectifier circuit has an action of rectifying a polarity of the wireless signal. The signal is rectified and then smoothened by the storage capacitor. Then, a high power supply potential (VDD) is generated.

The wireless signal received by the antenna 917 is also transmitted to the rectifier circuit 906 via the high-frequency circuit 914. The signal is rectified and then demodulated by the demodulation circuit 907. The demodulated signal is amplified by the analog amplifier 908.

Further, the wireless signal received by the antenna 917 is also transmitted to the clock generation circuit 903 via the high-frequency circuit 914. The signal transmitted to the clock generation circuit 903 is frequency-divided to be a reference clock signal. Here, the reference clock signal is transmitted to each circuit block and used for latching a signal, selecting a signal, and the like.

The signal amplified by the analog amplifier 908 and the reference clock signal are transmitted to a code extraction circuit 904. In the code extraction circuit 904, an instruction transmitted from the interrogator (also referred to as a reader/writer) 223 to the semiconductor device 931 is extracted from the signal amplified by the analog amplifier 908. The code extraction circuit 904 also forms a signal for controlling a code identification circuit 905.

The instruction extracted by the code extraction circuit 904 is transmitted to the code identification circuit 905. The code identification circuit 905 identifies the instruction transmitted from the interrogator (also referred to as a reader/writer) 223. The code identification circuit 905 also has a role of controlling the CRC circuit 902, the mask ROM 900, and the signal output control circuit 901.

In this manner, the instruction transmitted from the interrogator (also referred to as a reader/writer) 223 is identified, and the CRC circuit 902, the mask ROM 900, and the signal output control circuit 901 are operated in accordance with the identified instruction. In addition, a signal including individual data such as an ID number which is stored in or written to the mask ROM 900, is output.

Here, the mask ROM 900 includes the memory cell array 920, the column decoder 921, and the row decoder 922.

The signal output control circuit 901 has a role of converting the signal including the individual data such as the ID number which is stored in or written to the mask ROM 900 into a signal encoded by an encoding method to which a standard of the ISO or the like is applied.

Last, in accordance with the encoded signal, the signal transmitted to the antenna 917 is modulated by the modulation circuit 909.

The modulated signal is received by the antenna unit 222 which is electrically connected to the interrogator (also referred to as a reader/writer) 223. Then, the received signal is analyzed by the interrogator (also referred to as a reader/writer) 223, so that the individual data such as the ID number of the semiconductor device 931 formed using the present invention can be recognized.

In a wireless communication system using the semiconductor device 931 capable of wireless communication that uses an IC, formed using the present invention, the semiconductor device 931, an interrogator (also referred to as a reader/writer) having a known structure, an antenna electrically connected to the interrogator (also referred to as a reader/writer), and a control terminal for controlling the interrogator (also referred to as a reader/writer) can be used. A communication method of the semiconductor device 931 and the antenna electrically connected to the interrogator (also referred to as a reader/writer) is a one-way communication or two-way communication, and any of a space division multiplexing method, a polarization division multiplexing method, a frequency-division multiplexing method, a time-division multiplexing method, a code division multiplexing method, and an orthogonal frequency division multiplexing method can also be used.

The wireless signal is a signal in which a carrier wave is modulated. Modulation of a carrier wave is an analog modulation or a digital modulation, which may be any of an amplitude modulation, a phase modulation, a frequency modulation, and spread spectrum.

As for a frequency of a carrier wave, any of the following can be employed: a submillimeter wave of greater than or equal to 300 GHz and less than or equal to 3 THz; an extra high frequency of greater than or equal to 30 GHz and less than 300 GHz; a super high frequency of greater than or equal to 3 GHz and less than 30 GHz; an ultra high frequency of greater than or equal to 300 MHz and less than 3 GHz; a very high frequency of greater than or equal to 30 MHz and less than 300 MHz; a high frequency of greater than or equal to 3 MHz and less than 30 MHz; a medium frequency of greater than or equal to 300 KHz and less than 3 MHz; a low frequency of greater than or equal to 30 KHz and less than 300 KHz; and a very low frequency of greater than or equal to 3 KHz and less than 30 KHz.

This embodiment can be implemented in combination with any of the embodiment modes or other embodiments if needed.

Embodiment 2

Embodiment 2 will describe examples in which an external antenna is provided for a semiconductor device formed using the present invention, with reference to FIGS. 24A to 24E and FIGS. 25A and 25B.

Figure 24A:
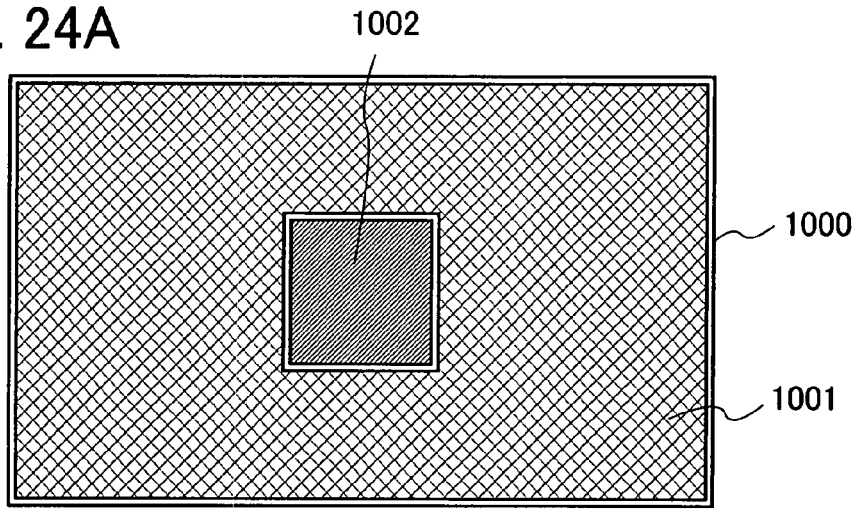
FIGS. 24A to 24E are top views of semiconductor devices according to the present invention.

FIG. 24A shows a case where a sheet of antenna covers the periphery of a semiconductor device. An antenna 1001 is formed over a substrate 1000 and a semiconductor device 1002 formed using the present invention is electrically connected thereto. In FIG. 24A, the antenna 1001 covers the periphery of the semiconductor device 1002, however, the antenna 1001 may cover the entire surface of the substrate and the semiconductor device 1002 having electrodes may be attached thereto.

Figure 24B:
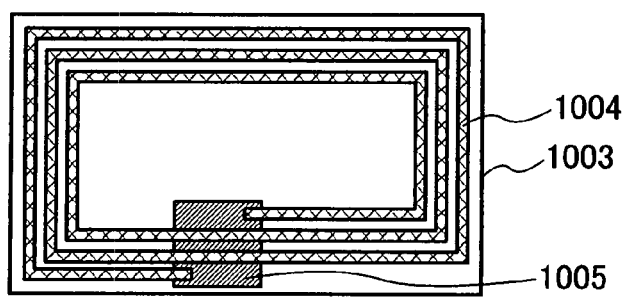

FIG. 24B shows an example of a coil antenna in which an antenna is arranged to circle around a semiconductor device. An antenna 1004 is formed over a substrate 1003 and a semiconductor device 1005 formed using the present invention is connected thereto. It is to be noted that the arrangement of the antenna is only an example and the invention is not limited to this.

Figure 24C:
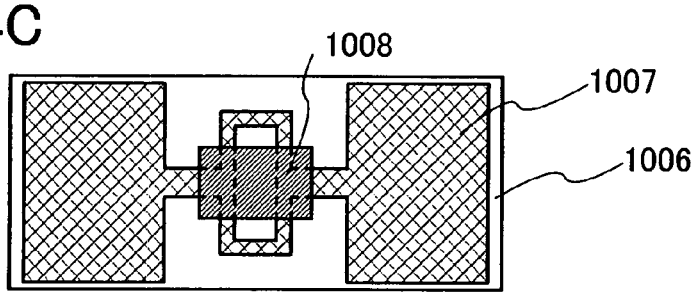

FIG. 24C shows an antenna for high frequency. An antenna 1007 is formed over a substrate 1006 and a semiconductor device 1008 formed using the present invention is electrically connected thereto.

Figure 24D:
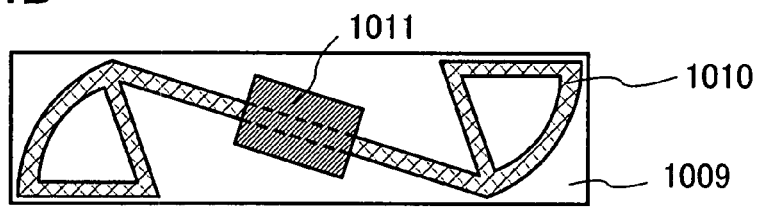

FIG. 24D shows a 180° omni-directional antenna (capable of receiving signals equally from any directions). An antenna 1010 is formed over a substrate 1009 and a semiconductor device 1011 formed using the present invention is electrically connected thereto.

Figure 24E:
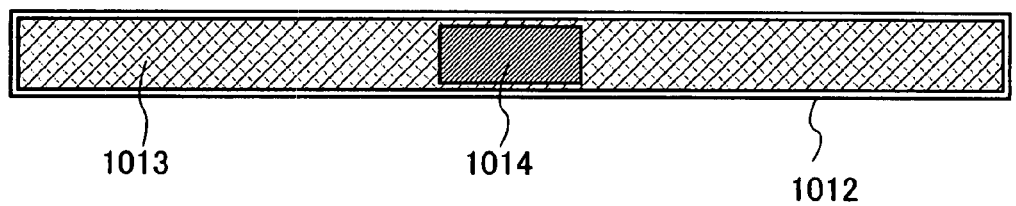

FIG. 24E shows an antenna extended in a stick shape. An antenna 1013 is formed over a substrate 1012 and a semiconductor device 1014 formed using the present invention is electrically connected thereto.

Figure 25A:
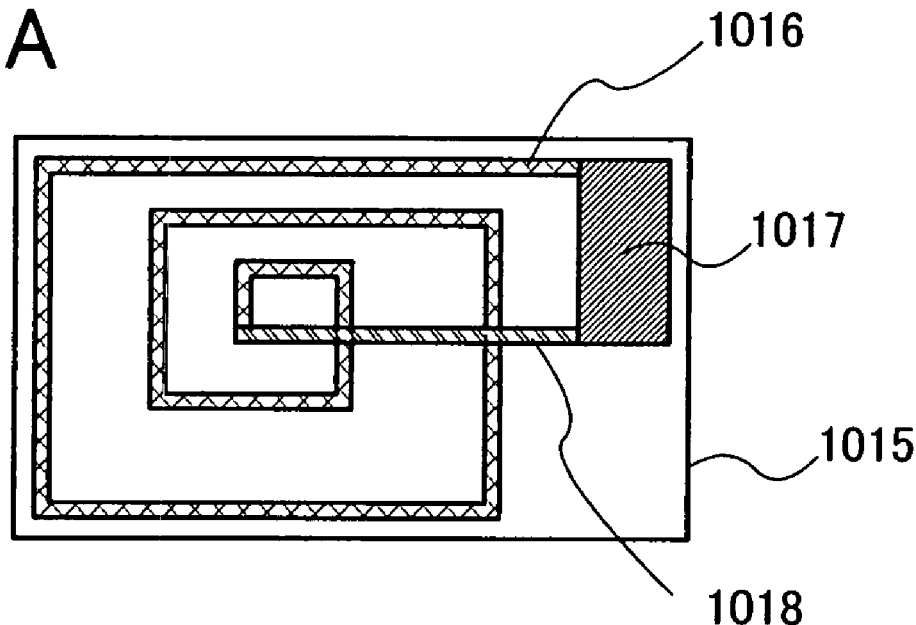
FIGS. 25A and 25B are top views of semiconductor devices according to the present invention.

Further, FIG. 25A shows another example of a coil antenna. An antenna 1016 is formed over a substrate 1015, and a semiconductor device 1017 formed using the present invention is electrically connected thereto. One end portion of the antenna 1016 is connected to the semiconductor device 1017. The other end portion of the antenna 1016 is connected to a wiring 1018 which is formed in a different process from that of the antenna 1016, and is electrically connected to the semiconductor device 1017 through the wiring 1018. In FIG. 25A, the wiring 1018 is formed over the antenna 1016; however, it may be formed below the antenna 1016.

Figure 25B:
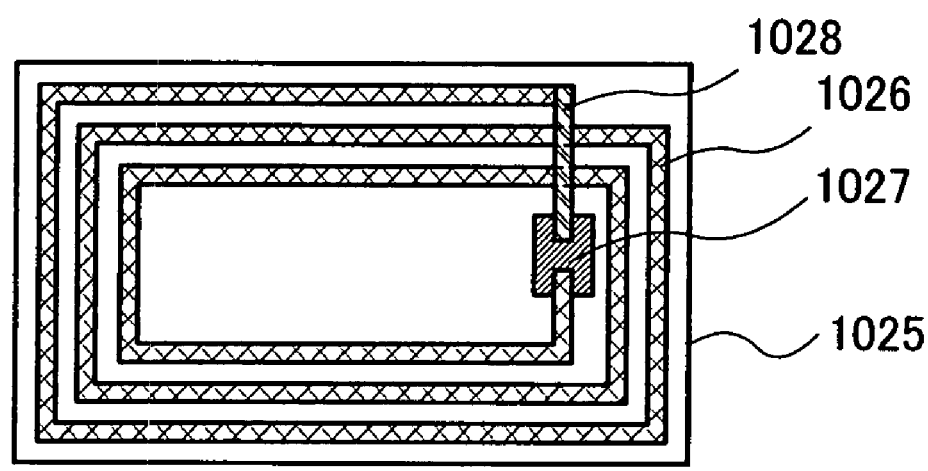

FIG. 25B shows another example of a coil antenna. An antenna 1026 is formed over a substrate 1025, and a semiconductor device 1027 formed using the present invention is electrically connected thereto. One end portion of the antenna 1026 is connected to the semiconductor device 1027. The other end portion of the antenna 1026 is connected to a wiring 1028 which is formed in a different process from that of the antenna 1026, and is electrically connected to the semiconductor device 1027 through the wiring 1028. In FIG. 25B, the wiring 1028 is formed over the antenna 1026; however, it may be formed below the antenna 1026.

A semiconductor device formed using the present invention and the above-described antenna can be connected by a known method. For example, the antenna and the semiconductor device are connected by wire bonding or bump bonding. Alternatively, a circuit chip having an electrode on an entire surface thereof may be attached to the antenna; in this method, an ACF (anisotropic conductive film) can be used for the attachment.

An appropriate length of the antenna varies depending on a frequency for receiving signals. For example, when the frequency is 2.45 GHz, in the case of providing a half-wave dipole antenna, the length of the antenna may be a half wavelength (about 60 mm), and in the case of providing a monopole antenna, the length may be a quarter wavelength (about 30 mm).

It is to be noted that the example shown in this embodiment is only an example and the shape of the antenna is not limited. The present invention can be implemented with any shape of the antenna. This embodiment can be implemented by using any combination with the above embodiment modes and the other embodiments.

Embodiment 3

Figure 26A:
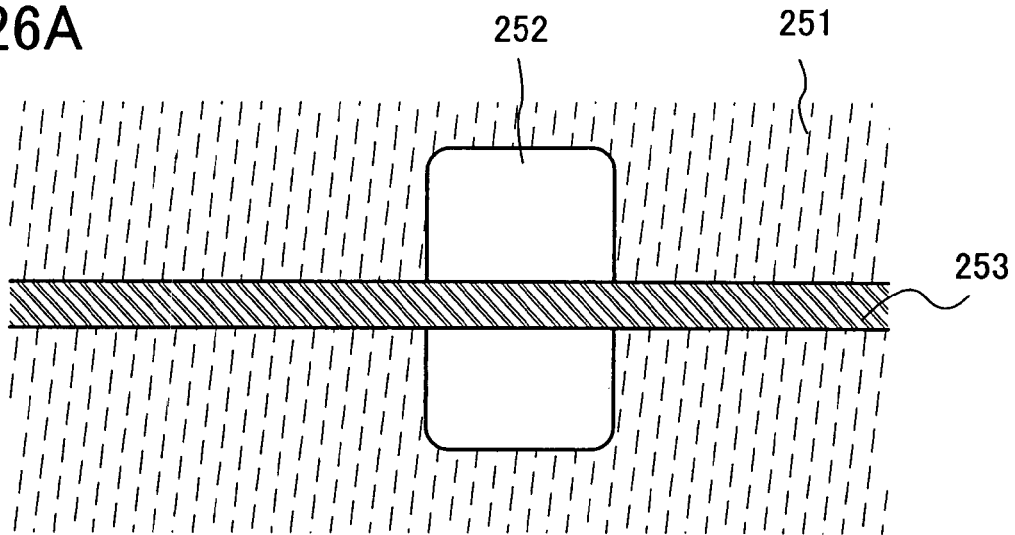
FIGS. 26A to 26C are top views of a semiconductor device according to the present invention.
Figure 26B:
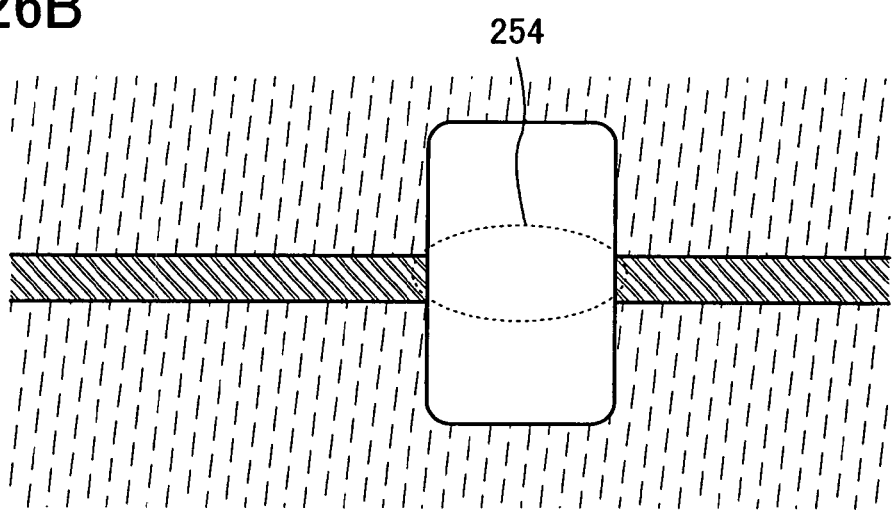
Figure 26C:
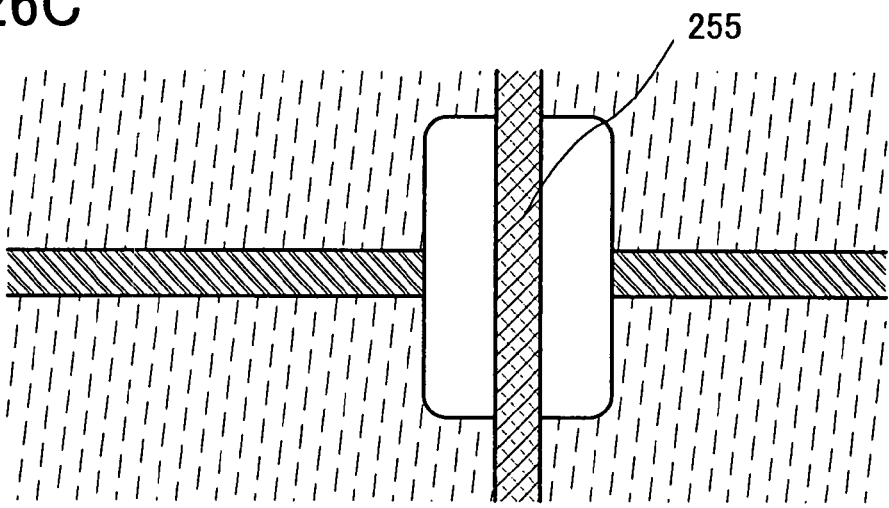

Embodiment 3 will describe a method for forming a separation region differently from that in Embodiment Mode 1, with reference to FIGS. 26A to 26C.

In Embodiment Mode 1, the electrode 110 is in contact with the electrolyte through the contact hole 168 which is formed in the insulating film 135 as shown in FIG. 9B. However, in this embodiment mode, one portion of an insulating film is removed in advance, and an opening portion is formed. Then, an electrode or wiring formed in the opening portion is soaked in an electrolyte while being applied with a voltage, so that the electrode or wiring is removed.

As shown in FIG. 26A, an opening portion 252 is provided in an insulating film 251. Further, an electrode or wiring 253 is formed in the opening portion 252. Note that the electrode or wiring 253 is formed over the insulating film 251 in FIG. 26A; however, according to need, the insulating film 251 may be formed over the electrode or wiring 253 and then the opening portion 252 may be formed.

Then, the electrode or wiring 253 in the opening portion 252 is soaked in an electrolyte while being applied with a voltage, thereby dissolving the electrode or wiring 253. Thus, a separation region 254 is formed (FIG. 26B). As the material for the electrode or wiring 253 and the electrolyte, those shown in Table 1 may be employed.

Next, an electrode or wiring 255 is formed in the separation region 254. The electric connection between the electrode or wiring 253 and the electrode or wiring 255 is blocked by the separation region 254.

This embodiment can be implemented in combination with any of the embodiment modes and the other embodiments as needed.

A semiconductor device of the present invention can be utilized for an IC tag which is used in a distribution field as a shipping tag for being attached to a packing box of a product or to the product itself. In addition, the semiconductor device can be utilized for an IC tag which is attached to a passenger's luggage in air transport or railway transport. Further, in a medical field, when the semiconductor device is attached to a medical chart for example, the medical chart can be handled quickly and accurately. The semiconductor device of the present invention can be used in every field in a ubiquitous society.

Data for identification needs to be stored in each of these IC tags. When the present invention is applied, productivity of IC tags in each of which identification data is stored in advance can be improved, and manufacturing time and manufacturing cost can be reduced.

This application is based on Japanese Patent Application serial no. 2006-199354 filed in Japan Patent Office on Jul. 21, 2006, the entire contents of which are hereby incorporated by reference.

What is claimed is:

1. A manufacturing method of a semiconductor device, comprising the steps of:
    forming an island-shaped semiconductor film, a gate insulating film, and a gate electrode over a substrate;
    adding an impurity imparting one conductivity type into the island-shaped semiconductor film to form a channel forming region, a source region, and a drain region in the island-shaped semiconductor film;
    forming a first interlayer insulating film to cover the island-shaped semiconductor film, the gate insulating film, and the gate electrode;
    forming a first electrode which is electrically connected to one of the source region and the drain region, over the first interlayer insulating film;
    forming a second electrode which is electrically connected to the other of the source region and the drain region, over the first interlayer insulating film;
    forming a second interlayer insulating film to cover the first interlayer insulating film, the first electrode, and the second electrode;
    forming a first contact hole reaching the first electrode, in the second interlayer insulating film;
    forming a second contact hole reaching the second electrode, in the second interlayer insulating film;
    soaking the first electrode and the second electrode in an electrolyte and applying voltage to one of the first electrode and the second electrode to dissolve the one of the first electrode and the second electrode and to form a separation region;
    forming a first wiring which is not electrically connected to the one of the first electrode and the second electrode, in one of the first contact hole and the second contact hole and on the second interlayer insulating film; and
    forming a second wiring which is electrically connected to the other of the first electrode and the second electrode through the other of the first contact hole and the second contact hole, on the second interlayer insulating film.

2. The manufacturing method of a semiconductor device according to claim 1, wherein the semiconductor device is used in a nonvolatile memory circuit.

3. The manufacturing method of a semiconductor device according to claim 1, wherein each of the first electrode and the second electrode comprises at least one element selected from the group consisting of aluminum, tungsten, titanium, tantalum, molybdenum, nickel, cobalt, iron, platinum, copper, gold, silver, manganese, neodymium, carbon, and silicon.

4. The manufacturing method of a semiconductor device according to claim 1, wherein the electrolyte comprises at least one selected from the group consisting of potassium hydroxide, phosphate, sulfuric acid, chromic acid, and potassium ferrocyanide.

5. The manufacturing method of a semiconductor device according to claim 1, wherein each of the first wiring and the second wiring comprises at least one element selected from the group consisting of aluminum, tungsten, titanium, tantalum, molybdenum, nickel, cobalt, iron, platinum, copper, gold, silver, manganese, neodymium, carbon, and silicon.

6. The manufacturing method of a semiconductor device according to claim 1, wherein the semiconductor device is a mask ROM.

7. A manufacturing method of a semiconductor device, comprising the steps of:
    forming a first island-shaped semiconductor film, a second island-shaped semiconductor film, a gate insulating film, a first gate electrode, and a second gate electrode over a substrate;
    adding an impurity imparting one conductivity type into the first island-shaped semiconductor film and the second island-shaped semiconductor film to form a first channel forming region, a first source region, and a first drain region in the first island-shaped semiconductor film and to form a second channel forming region, a second source region, and a second drain region in the second island-shaped semiconductor film;
    forming a first interlayer insulating film to cover the first island-shaped semiconductor film, the second island-shaped semiconductor film, the gate insulating film, the first gate electrode, and the second gate electrode;
    forming a first electrode which is electrically connected to one of the first source region and the first drain region, over the first interlayer insulating film;
    forming a second electrode which is electrically connected to the other of the first source region and the first drain region, over the first interlayer insulating film;
    forming a third electrode which is electrically connected to one of the second source region and the second drain region, over the first interlayer insulating film;
    forming a fourth electrode which is electrically connected to the other of the second source region and the second drain region, over the first interlayer insulating film;
    forming a second interlayer insulating film to cover the first interlayer insulating film and the first to fourth electrodes;
    forming a first contact hole reaching the first electrode, in the second interlayer insulating film;

forming a second contact hole reaching the second electrode, in the second interlayer insulating film;
forming a third contact hole reaching the third electrode, in the second interlayer insulating film;
forming a fourth contact hole reaching the fourth electrode, in the second interlayer insulating film;
soaking the first to fourth electrodes in an electrolyte and applying voltage to the third electrode to dissolve the third electrode and form a separation region;
forming a first wiring which is electrically connected to the first electrode through the first contact hole, on the second interlayer insulating film;
forming a second wiring which is electrically connected to the second electrode through the second contact hole, on the second interlayer insulating film;
forming a third wiring which is not electrically connected to the third electrode, in the third contact hole and on the second interlayer insulating film; and
forming a fourth wiring which is electrically connected to the fourth electrode through the fourth contact hole, on the second interlayer insulating film.

8. The manufacturing method of a semiconductor device according to claim 7, wherein the semiconductor device is used in a nonvolatile memory circuit.

9. The manufacturing method of a semiconductor device according to claim 7, wherein each of the first to fourth electrodes comprises at least one element selected from the group consisting of aluminum, tungsten, titanium, tantalum, molybdenum, nickel, cobalt, iron, platinum, copper, gold, silver, manganese, neodymium, carbon, and silicon.

10. The manufacturing method of a semiconductor device according to claim 7, wherein the electrolyte comprises at least one selected from the group consisting of potassium hydroxide, phosphate, sulfuric acid, chromic acid, and potassium ferrocyanide.

11. The manufacturing method of a semiconductor device according to claim 7, wherein each of the first to fourth wirings comprises at least one element selected from the group consisting of aluminum, tungsten, titanium, tantalum, molybdenum, nickel, cobalt, iron, platinum, copper, gold, silver, manganese, neodymium, carbon, and silicon.

12. The manufacturing method of a semiconductor device according to claim 7, wherein the semiconductor device is a mask ROM.

* * * * *